US012032293B2

United States Patent
Kori et al.

(10) Patent No.: US 12,032,293 B2
(45) Date of Patent: Jul. 9, 2024

(54) COMPOSITION FOR FORMING ORGANIC FILM, PATTERNING PROCESS, AND POLYMER

(71) Applicant: SHIN-ETSU CHEMICAL CO., LTD., Tokyo (JP)

(72) Inventors: Daisuke Kori, Joetsu (JP); Takayoshi Nakahara, Joetsu (JP); Yasuyuki Yamamoto, Joetsu (JP); Hironori Satoh, Joetsu (JP); Tsutomu Ogihara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 881 days.

(21) Appl. No.: 16/841,773

(22) Filed: Apr. 7, 2020

(65) Prior Publication Data

US 2020/0356007 A1 Nov. 12, 2020

(30) Foreign Application Priority Data

May 8, 2019 (JP) .................................. 2019-88216

(51) Int. Cl.
 *G03F 7/11* (2006.01)
 *C08G 61/02* (2006.01)
 (Continued)

(52) U.S. Cl.
 CPC ................ *G03F 7/11* (2013.01); *C08G 61/02* (2013.01); *C08L 83/04* (2013.01); *G03F 7/34* (2013.01);
 (Continued)

(58) Field of Classification Search
 CPC .............. C08G 2261/148; C08G 61/02; C08G 2261/133; C08G 2261/1424; C08L 65/00; G03F 7/004
 See application file for complete search history.

(56) References Cited

U.S. PATENT DOCUMENTS 9,416,296 B2 * 8/2016 Lee .......................... G03F 7/40
10,084,137 B2 * 9/2018 Judd ................... C07D 207/46
(Continued)

FOREIGN PATENT DOCUMENTS

JP   106-118651 A    4/1994
JP   2002-334869 A   11/2002
(Continued)

OTHER PUBLICATIONS

Translated Description from Hatakeyama (Year: 2010).*
(Continued)

*Primary Examiner* — Sean M DeGuire
*Assistant Examiner* — Andrew Preston Traywick
(74) *Attorney, Agent, or Firm* — Oliff PLC

(57) ABSTRACT

A composition for forming an organic film contains a polymer having a partial structure shown by the following general formula (1A), and an organic solvent. The polymer is crosslinked by dehydrogenative coupling reaction involving hydrogen atoms located at the trityl position on the fluorene ring in each partial structure. Thus, the present invention provides: a composition for forming an organic film the composition containing such a thermosetting polymer with high carbon content as to enable high etching (Continued)

resistance and excellent twisting resistance; a patterning process using the composition; and a polymer suitable for the composition for forming an organic film

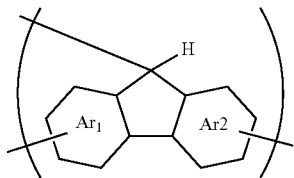

(1A)

17 Claims, 2 Drawing Sheets

(51) Int. Cl.
  C08L 83/04 (2006.01)
  G03F 7/00 (2006.01)
  G03F 7/34 (2006.01)
  H01L 21/311 (2006.01)
(52) U.S. Cl.
  CPC ............ *G03F 7/70283* (2013.01); *C08G 2261/135* (2013.01); *C08G 2261/3142* (2013.01); *C08G 2261/90* (2013.01); *H01L 21/31144* (2013.01)

(56) References Cited

U.S. PATENT DOCUMENTS

| 2002/0106909 A1 | 8/2002 | Kato et al. |
| 2005/0255712 A1 | 11/2005 | Kato et al. |
| 2006/0019195 A1 | 1/2006 | Hatakeyama et al. |
| 2006/0204891 A1 | 9/2006 | Hatakeyama |
| 2009/0274978 A1 | 11/2009 | Ohashi et al. |
| 2010/0099044 A1 | 4/2010 | Hatakeyama et al. |
| 2012/0064725 A1* | 3/2012 | Kinsho ............ G03F 7/20 438/782 |
| 2013/0302990 A1 | 11/2013 | Watanabe et al. |
| 2014/0246400 A1 | 9/2014 | Higashihara et al. |
| 2017/0199457 A1 | 7/2017 | Hatakeyama et al. |
| 2019/0196073 A1* | 6/2019 | Samejima ............ H01L 31/101 |

FOREIGN PATENT DOCUMENTS

| JP | 2004-205685 A | 7/2004 | |
| JP | 2005-128509 A | 5/2005 | |
| JP | 2005-250434 A | 9/2005 | |
| JP | 2006-227391 A | 8/2006 | |
| JP | 2006-285095 A | 10/2006 | |
| JP | 2006-293298 A | 10/2006 | |
| JP | 2007-199653 A | 8/2007 | |
| JP | 2008-158002 A | 7/2008 | |
| JP | 2009-269953 A | 11/2009 | |
| JP | 2010-122656 A | 6/2010 | |
| JP | 2010-271654 | * 12/2010 | ............ G03F 7/11 |
| JP | 2010-271654 A | 12/2010 | |
| JP | 2010271654 A | * 12/2010 | ............ G03F 7/11 |
| JP | 2013-253227 A | 12/2013 | |
| WO | 2004/066377 A1 | 8/2004 | |
| WO | 2013/047106 A1 | 4/2013 | |
| WO | 2019/080550 A1 | 5/2019 | |

OTHER PUBLICATIONS

Translated Claims from Hatakeyama (Year: 2010).*
Translation of JP2008250074A Description (Year: 2008).*
Original Description of JP2008250074A (Year: 2008).*
Oct. 20, 2020 Extended European Search Report issued in European Patent Application No. 20173590.9.
Ranger M et al: "New Base-Doped Polyfluorene Derivatives", Macromolecules, American Chemical Society, vol. 32, No. 10, pp. 3306-3313, 1999.

* cited by examiner

[FIG. 1]
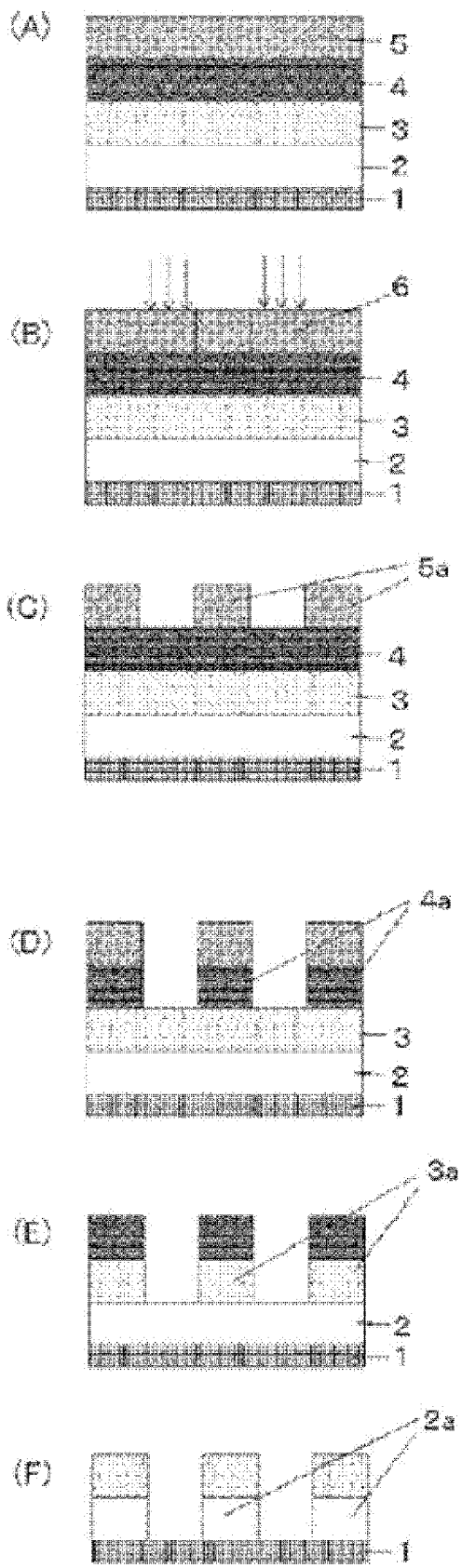

[FIG. 2]
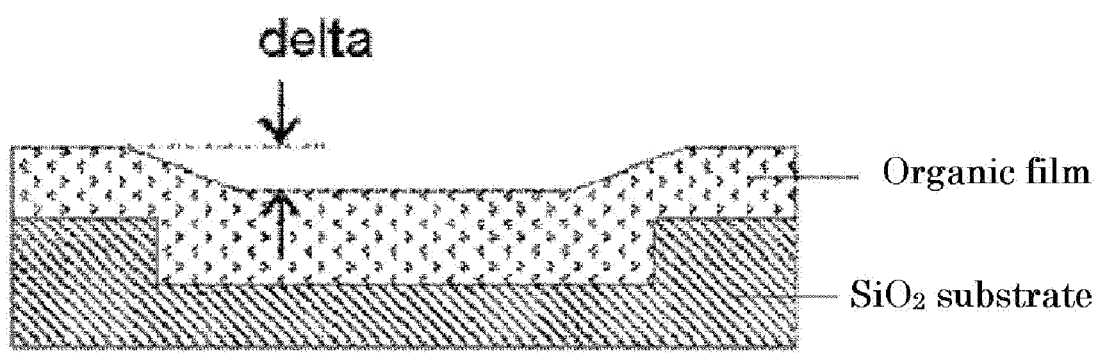

COMPOSITION FOR FORMING ORGANIC FILM, PATTERNING PROCESS, AND POLYMER

TECHNICAL FIELD

The present invention relates to a composition for forming an organic film, a patterning process using the composition, and a polymer contained in the composition.

BACKGROUND ART

Recently, along with advancements toward higher integration and higher processing speed of semiconductor devices, a finer pattern rule has been required. In this situation, various techniques have been developed in regard to how patterning process can be performed more finely and precisely depending on light sources used in lithography with light exposure, which is a commonly-employed technique at present.

As the light source for lithography employed in resist pattern formation, light exposure using a g-line (436 nm) or an i-line (365 nm) of a mercury lamp is widely adopted for portions where the degree of integration is low. Meanwhile, for portions where the degree of integration is high and finer patterning is required, lithography using a KrF excimer laser (248 nm) or an ArF excimer laser (193 nm) with shorter wavelengths has also been practically used. Moreover, for the most-advanced generation requiring further finer patterning, lithography with extreme ultraviolet ray (EUV, 13.5 nm) is about to be put into practical use.

It is well known that in a monolayer resist method, which is employed as a typical resist patterning process, as the thinning of resist patterns progresses as described above, the ratio of a pattern height to a pattern line width (aspect ratio) is increased, and pattern collapse occurs due to the surface tension of a developer during development. It is known that, in this situation, a multilayer resist method, in which a pattern is formed by laminating films having different dry etching properties, is excellent in forming a pattern with a high aspect ratio on an uneven substrate. There have been developed: a two-layer resist method in which a photoresist layer made of a silicon-containing photosensitive polymer is combined with an underlayer made of an organic polymer containing carbon, hydrogen, and oxygen as main constituent elements, for example, a novolak polymer (Patent Document 1 etc.); and a three-layer resist method in which a photoresist layer made of an organic photosensitive polymer used in a monolayer resist method is combined with a middle layer made of a silicon-based polymer or a silicon-based CVD film, and an underlayer made of an organic polymer (Patent Document 2 etc.).

In this three-layer resist method, first, a fluorocarbon-based dry etching gas is used to transfer the pattern of the photoresist layer to the silicon-containing middle layer. Then, using the pattern as a mask, dry etching with an oxygen-containing gas is performed to transfer the pattern to the organic underlayer film containing carbon and hydrogen as main constituent elements. The resultant is used as a mask to form the pattern on a substrate to be processed by dry etching. However, in semiconductor device manufacturing processes after the 20-nm generation, when such an organic underlayer film pattern is used as a hard mask to transfer the pattern to a substrate to be processed by dry etching, phenomena are observed in which the underlayer film pattern is twisted and/or curved.

The carbon hard mask formed immediately above the substrate to be processed is generally an amorphous carbon (hereinafter CVD-C) film prepared by a CVD method from a methane gas, an ethane gas, an acetylene gas, or the like as raw materials. It is known that the amount of hydrogen atoms in the CVD-C film can be reduced quite small, and the CVD-C film is very effective against the twisting and curving of the pattern as described above. Nevertheless, it is also known that when the substrate to be processed used as a base has a step, it is difficult to fill such a step into a flat state due to the characteristics of the CVD process. As a result, when a substrate to be processed having a step is coated with a CVD-C film and then patterned with a photoresist, the step of the substrate to be processed causes the applied surface of the photoresist to have a step. This makes the photoresist film thickness non-uniform, and consequently the focus margin and the pattern profile during lithography degradated.

On the other hand, it is known that when the underlayer film serving as the carbon hard mask formed immediately above the substrate to be processed is formed by a spin coating method, there is an advantage that a step(s) of the uneven substrate can be filled into a flat state. Planarizing the substrate using the underlayer film material reduces fluctuation in film thickness of a silicon-containing middle layer and a photoresist coated thereon, can increase the focus margin in lithography and can form a correct pattern.

Hence, there are demands for: a material of an organic underlayer film which allows formation of an organic underlayer film by a spin coating method, the organic underlayer film enabling formation of a film having high etching resistance in dry etching a substrate to be processed and high planarizing property on the substrate to be processed; and a method for forming such an organic underlayer film.

Conventionally, condensed resins using aromatic alcohols and carbonyl compounds such as ketones and aldehydes as condensing agents for a phenol compound or naphthol compound have been known as the underlayer film material for forming an organic film for multilayer resist methods. Examples of such condensed resins include a fluorene bisphenol novolak resin described in Patent Document 2, a bisphenol compound and a novolak resin thereof described in Patent Document 3, a novolak resin of an adamantane phenol compound described in Patent Document 4, a bisnaphthol compound and a novolak resin thereof described in Patent Document 5, and the like. The main skeletons of the resins used in these materials are naphthalene, fluorene, adamantane, or the like, each of which has high carbon density, but their etching resistance inevitably degradates due to the oxygen atom of the phenolic hydroxyl group.

Further, to prevent the etching resistance degradation, no heteroatom such as oxygen is incorporated into a resin for underlayer film material. As an example of such a resin, Patent Document 6 describes a resin having a fluorene structure. Nevertheless, to form a cured film, a methylol compound or the like is added as a crosslinking agent to a composition. For this reason, when this composition is used to form a cured film, even if the carbon content of the resin is increased, this increase is offset by the low carbon content of the crosslinking agent, resulting in the problem of etching resistance degradation.

CITATION LIST

Patent Literature

Patent Document 1: JP H06-118651 A
Patent Document 2: JP 2005-128509 A

Patent Document 3: JP 2006-293298 A
Patent Document 4: JP 2006-285095 A
Patent Document 5: JP 2010-122656 A
Patent Document 6: WO 2013/047106 A1

SUMMARY OF INVENTION

Technical Problem

The present invention has been made in view of the above-described circumstances. An object of the present invention is to provide: a composition for forming an organic film, the composition containing a polymer with high carbon content and thermosetting properties as to enable high etching resistance and excellent twisting resistance without impairing the resin-derived carbon content; a patterning process using this composition; and a polymer suitable for such a composition for forming an organic film.

Solution to Problem

To achieve the object, the present invention provides a composition for forming an organic film, comprising:
a polymer having a partial structure shown by the following general formula (1A); and
an organic solvent,

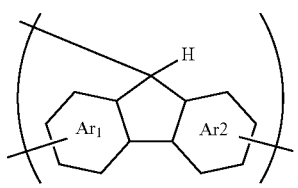

(1A)

wherein $Ar_1$ and $Ar_2$ each represent a benzene ring or a naphthalene ring which optionally have a substituent.

When an organic film formed from the above-described organic film composition containing the polymer having a partial structure shown by the general formula (1A) is heated, a crosslinking reaction takes place through dehydrogenative coupling reaction involving hydrogen atoms each located at the trityl position on the fluorene ring, so that the entire coating film thus formed has only condensed aromatic ring structures for exhibiting high etching resistance. Hence, the organic film is formed to have condensed aromatic ring structures not containing any other heteroatom. These make it possible to form an organic film having high curving resistance and high dry etching resistance besides filling characteristic by spin coating.

The polymer preferably further has a partial structure shown by the following general formula (1B),

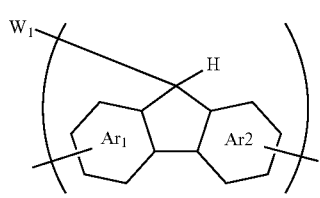

(1B)

wherein $W_1$ represents a hydroxyl group, an alkyloxy group having 1 to 10 carbon atoms, or an organic group having one or more aromatic rings which optionally have a substituent; and $Ar_1$ and $Ar_2$ each represent a benzene ring or a naphthalene ring which optionally have a substituent.

Introducing such a partial structure into the main skeleton can adjust required performances of the composition for forming an organic film, such as etching resistance, solvent solubility, and filling and planarizing properties.

The polymer preferably further has a partial structure shown by the following general formula (1C),

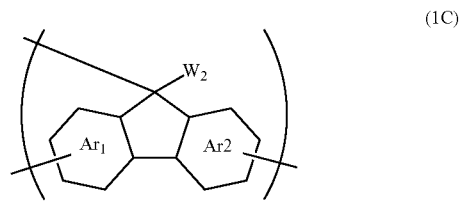

(1C)

wherein $W_2$ represents a monovalent organic group having 1 to 50 carbon atoms; and $Ar_1$ and $Ar_2$ are as defined above.

Introducing such a partial structure into the main skeleton enables more specific adjustments of required performances of the composition for forming an organic film, such as etching resistance, solvent solubility, and filling and planarizing properties.

The polymer preferably has a weight-average molecular weight of 500 to 5000.

The composition for forming an organic film contains the polymer having a weight-average molecular weight within such a range can suppress outgassing during baking without impairing the solubility into the organic solvent.

The organic solvent is preferably a mixture of one or more organic solvents each having a boiling point of lower than 180° C. and one or more organic solvents each having a boiling point of 180° C. or higher.

When the organic solvent is the mixture described as above, the addition of the high-boiling-point solvent(s) to the polymer imparts thermal flowability to the resulting organic film. Thus, the composition for forming an organic film has both high filling and planarizing properties.

The composition for forming an organic film preferably further comprises at least one of a surfactant and a plasticizer.

Incorporating the additive(s) makes the composition for forming an organic film more excellent in coatability and filling and planarizing properties.

The present invention provides a patterning process comprising the steps of:
forming an organic film by using the above-described composition for forming an organic film on a body to be processed;
forming a silicon-containing resist underlayer film by using a silicon-containing resist underlayer film material on the organic film;
forming a resist upper layer film by using a photoresist composition on the silicon-containing resist underlayer film;
forming a circuit pattern in the resist upper layer film;
transferring the pattern to the silicon-containing resist underlayer film by etching using the resist upper layer film having the formed circuit pattern as a mask;
transferring the pattern to the organic film by etching using the silicon-containing resist underlayer film having the transferred pattern as a mask; and forming the pattern in the body to be processed by etching using the organic film having the transferred pattern as a mask.

The patterning process according to the three-layer resist process described above makes it possible to precisely form a fine pattern in a substrate to be processed.

The present invention provides a patterning process comprising the steps of:

forming an organic film by using the above-described composition for forming an organic film on a body to be processed;

forming a silicon-containing resist underlayer film by using a silicon-containing resist underlayer film material on the organic film;

forming an organic antireflective coating (BARC) on the silicon-containing resist underlayer film;

forming a resist upper layer film by using a photoresist composition on the BARC;

forming a circuit pattern in the resist upper layer film;

successively transferring the pattern to the BARC and the silicon-containing resist underlayer film by etching using the resist upper layer film having the formed circuit pattern as a mask;

transferring the pattern to the organic film by etching using the silicon-containing resist underlayer film having the transferred pattern as a mask; and etching the body to be processed using the organic film having the transferred pattern as a mask to form the pattern in the body to be processed.

The patterning process according to the four-layer resist process described above makes it possible to more precisely form a fine pattern in a substrate to be processed.

The present invention provides a patterning process comprising the steps of:

forming an organic film by using the above-described composition for forming an organic film on a body to be processed;

forming an inorganic hard mask selected from a silicon oxide film, a silicon nitride film, and a silicon oxynitride film on the organic film;

forming a resist upper layer film by using a photoresist composition on the inorganic hard mask;

forming a circuit pattern in the resist upper layer film;

transferring the pattern to the inorganic hard mask by etching using the resist upper layer film having the formed circuit pattern as a mask;

transferring the pattern to the organic film by etching using the inorganic hard mask having the formed pattern as a mask; and etching the body to be processed using the organic film having the formed pattern as a mask to form the pattern in the body to be processed.

The patterning process according to this three-layer resist process makes it possible to precisely form a fine pattern in a substrate to be processed.

Further, the present invention provides a patterning process comprising the steps of:

forming an organic film by using the above-described composition for forming an organic film on a body to be processed;

forming an inorganic hard mask selected from a silicon oxide film, a silicon nitride film, and a silicon oxynitride film on the organic film;

forming a BARC on the inorganic hard mask;

forming a resist upper layer film by using a photoresist composition on the BARC;

forming a circuit pattern in the resist upper layer film;

successively transferring the pattern to the BARC and the inorganic hard mask by etching using the resist upper layer film having the formed circuit pattern as a mask;

transferring the pattern to the organic film by etching using the inorganic hard mask having the formed pattern as a mask; and etching the body to be processed using the organic film having the formed pattern as a mask to form the pattern in the body to be processed.

The patterning process according to this four-layer resist process makes it possible to more precisely form a fine pattern in a substrate to be processed.

The inorganic hard mask is preferably formed by a CVD method or an ALD method.

When the inorganic hard mask is formed by a CVD method or an ALD method, a fine pattern can be formed more precisely in a substrate to be processed.

The circuit pattern is preferably formed in the resist upper layer film by a photolithography with a wavelength of 10 nm or more and 300 nm or less, direct lithography with electron beam, nanoimprinting, or a combination thereof.

When these methods are employed as the method for forming the circuit pattern in the resist upper layer film, a fine pattern can be formed more precisely in a substrate to be processed.

Preferably, alkali development or organic solvent development is employed as a development method.

When the development method is performed using an alkali or organic solvent, it is possible to more precisely form a fine pattern in a substrate to be processed.

The body to be processed is preferably a semiconductor device substrate, a metal film, a metal carbide film, a metal oxide film, a metal nitride film, a metal oxycarbide film, or a metal oxynitride film.

In the present invention, the aforementioned bodies to be processed are usable, for example.

The metal is preferably silicon, titanium, tungsten, hafnium, zirconium, chromium, germanium, copper, silver, gold, aluminum, indium, gallium, arsenic, palladium, iron, tantalum, iridium, molybdenum, or an alloy thereof.

These can be used as the metal.

The present invention provides a polymer comprising a partial structure shown by the following general formula (1A),

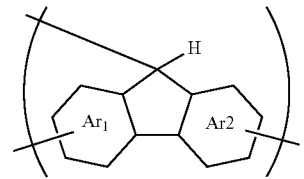

(1A)

wherein $Ar_1$ and Ar2 each represent a benzene ring or a naphthalene ring which optionally have a substituent.

This polymer is to be an organic film formed to have condensed aromatic ring structures containing no other heteroatom. Thus, this component can provide a composition for forming an organic film which can form an organic film having not only high curving resistance but also high dry etching resistance, besides filling property by spin coating.

The polymer preferably further comprises a partial structure shown by the following general formula (1B),

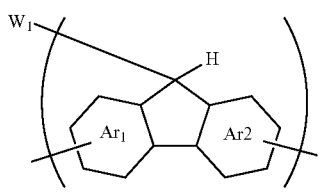

(1B)

wherein W₁ represents a hydroxyl group, an alkyloxy group having 1 to 10 carbon atoms, or an organic group having one or more aromatic rings which optionally have a substituent; and Ar₁ and Ar2 each represent a benzene ring or a naphthalene ring which optionally have a substituent.

The polymer further having this partial structure is a component that provides a composition for forming an organic film which can form an organic film having high curving resistance and also high dry etching resistance.

The polymer preferably further comprises a partial structure shown by the following general formula (1C),

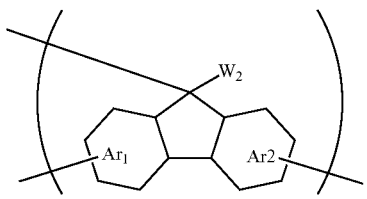

(1C)

wherein W₂ represents a monovalent organic group having 1 to 50 carbon atoms; and Ar₁ and Ar2 are as defined above.

The polymer further having this partial structure is a component that provides a composition for forming an organic film which can form an organic film having high curving resistance and also high dry etching resistance.

Advantageous Effects of Invention

As described above, the inventive polymer has a thermosetting property by itself and is constituted only of condensed aromatic rings containing no heteroatom which would otherwise impair etching resistance. Hence, the polymer is useful for forming an organic film excellent in etching resistance and twisting resistance. Moreover, the inventive composition for forming an organic film containing this polymer is a useful material for forming an organic film having excellent etching resistance and twisting resistance as well as various properties such as heat resistance, and filling and planarizing properties. Thus, the inventive composition is quite useful as a resist underlayer film material in multilayer resist processes, for example, a two-layer resist process, a three-layer resist process using a silicon-containing resist underlayer film, and a four-layer resist process using a silicon-containing resist underlayer film and an organic antireflective coating. Further, the inventive patterning processes make it possible to precisely form a fine pattern in a substrate to be processed in such multilayer resist processes.

BRIEF DESCRIPTION OF DRAWINGS

FIG. 1 shows an exemplary process flow of the inventive patterning process.

FIG. 2 is a cross-sectional view for illustrating an exemplary organic film formed by applying the inventive organic film composition on a SiO₂ wafer substrate having a trench pattern.

DESCRIPTION OF EMBODIMENTS

As described above, there have been demands for the development of: a composition for forming an organic film, the composition containing a polymer with high carbon content and thermosetting property as to enable high etching resistance and excellent twisting resistance without impairing the resin-derived carbon content; a patterning process using this composition; and a polymer suitable for such a composition for forming an organic film.

The present inventors have earnestly studied the above-described object and consequently found the following facts. Specifically, a polymer having a certain partial structure in which hydrogen is located at a trityl position on a fluorene ring is crosslinked by coupling reaction involving dehydrogenation of such hydrogen atoms located at the trityl position in each partial structure. A composition for forming an organic film contains this polymer and an organic solvent and thereby results in an organic film which is formed of a resin having condensed aromatic ring structures containing no heteroatom. The organic film has high curving resistance and high dry etching resistance and also has high filling performance due to spin coating. These findings have led to the completion of the present invention.

Specifically, the present invention is a composition for forming an organic film, comprising:
a polymer having a partial structure shown by the following general formula (1A); and
an organic solvent,

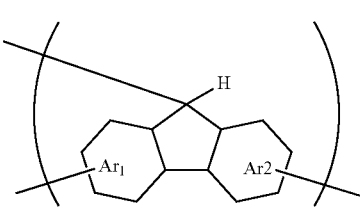

(1A)

wherein Ar₁ and Ar2 each represent a benzene ring or a naphthalene ring which optionally have a substituent.

Hereinafter, embodiments of the present invention will be described in detail, but the present invention is not limited thereto.

The inventive composition for forming an organic film contains a polymer having a partial structure shown by the following general formula (1A):

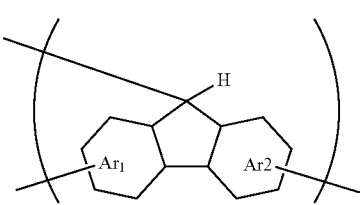

(1A)

where Ar₁ and Ar2 each represent a benzene ring or a naphthalene ring which optionally have a substituent.

Examples of the partial structure constituted of Ar1 and Ar2 in the general formula (1A) of the polymer include the following. These aromatic rings optionally have a substituent thereon, such as a vinyl group, an ethynyl group, an ethynylphenyl group, an allyl group, a propargyl group, an aryl group, an allyloxy group, or a propargyloxy group. Among the following structures, fluorene and benzofluorene structures are preferable in view of availability of the raw materials.

Examples of the organic group having one or more aromatic rings as $W_1$ in the general formula (1B) include the following. These aromatic rings optionally have a substituent thereon, such as a vinyl group, an ethynyl group, an ethynylphenyl group, an allyl group, a propargyl group, an aryl group, an allyloxy group, or a propargyloxy group. From the viewpoints of imparting etching resistance and solvent solubility, the organic group preferably has a naphthalene ring, a fluorene structure, or a carbazole structure.

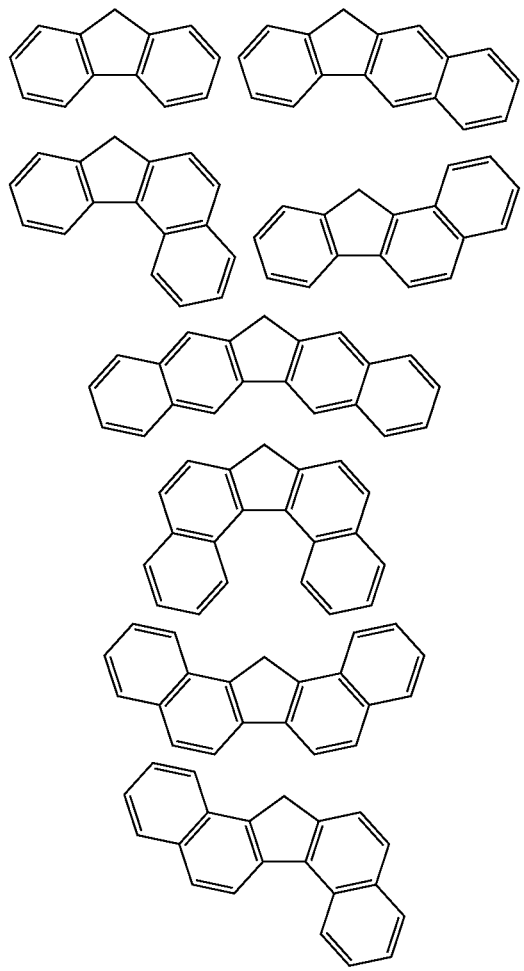

The polymer preferably further has a partial structure shown by the following general formula (1B):

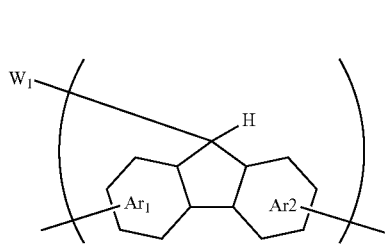

(1B)

where $W_1$ represents a hydroxyl group, an alkyloxy group having 1 to 10 carbon atoms, or an organic group having one or more aromatic rings which optionally have a substituent; and $Ar_1$ and Ar2 each represent a benzene ring or a naphthalene ring which optionally have a substituent.

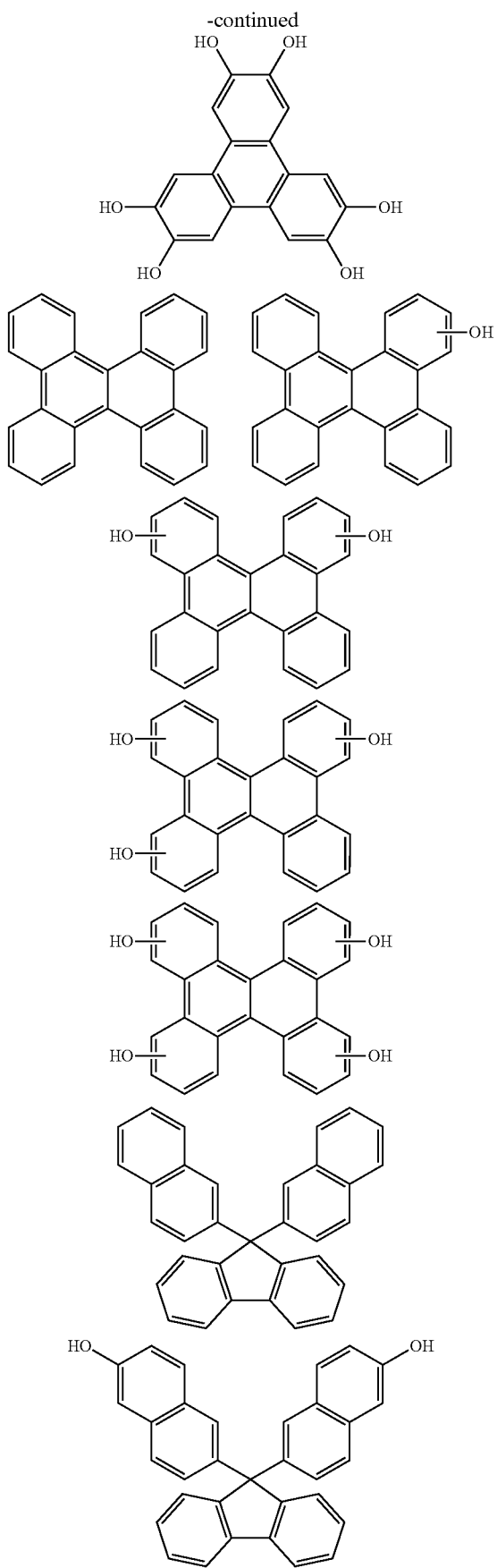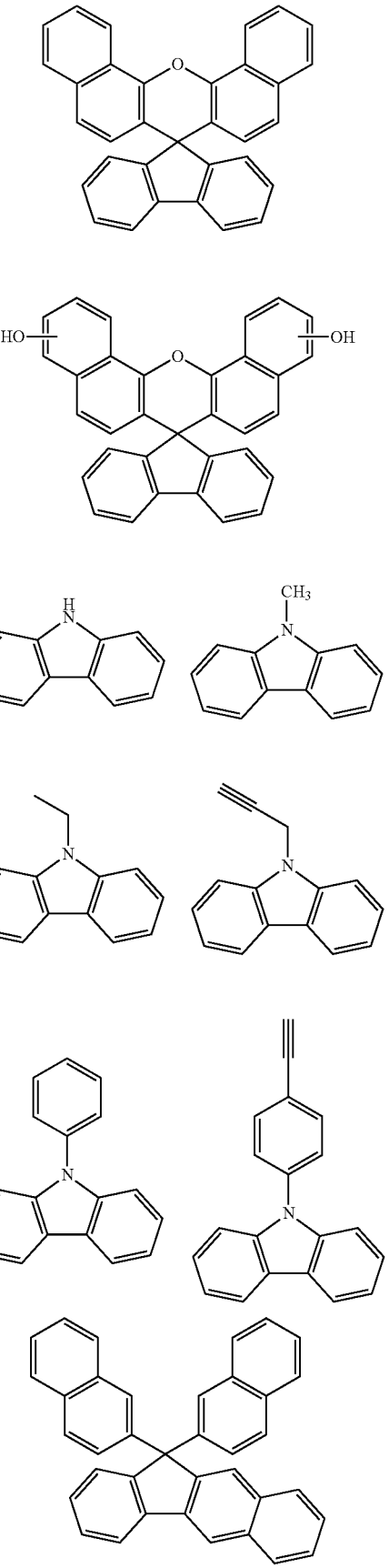

-continued
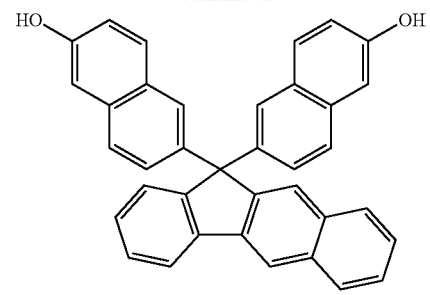
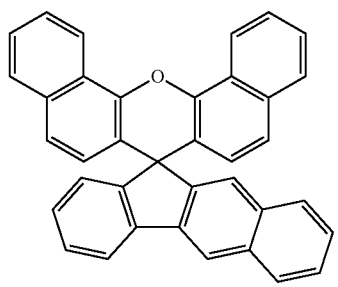
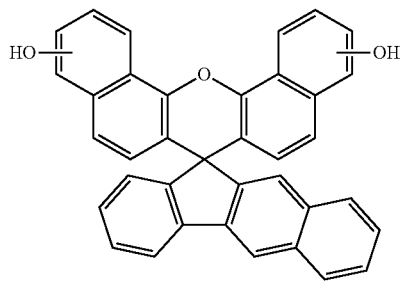
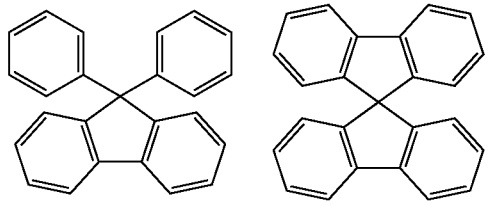
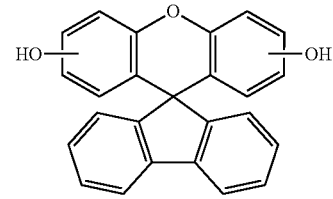
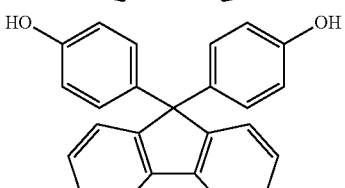
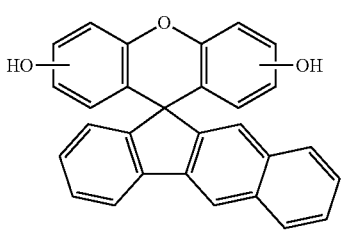
-continued
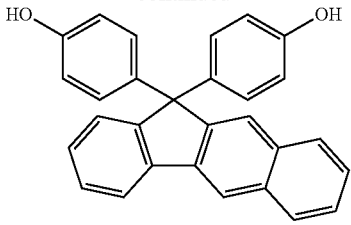
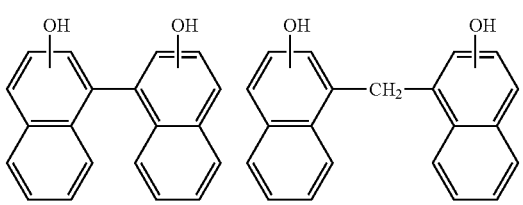
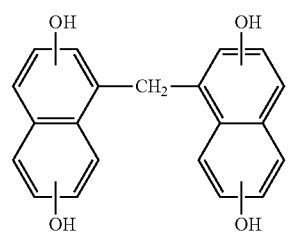
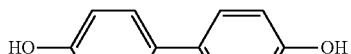
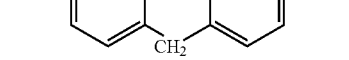
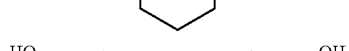
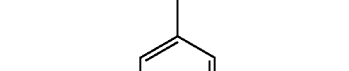
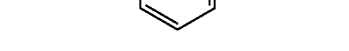

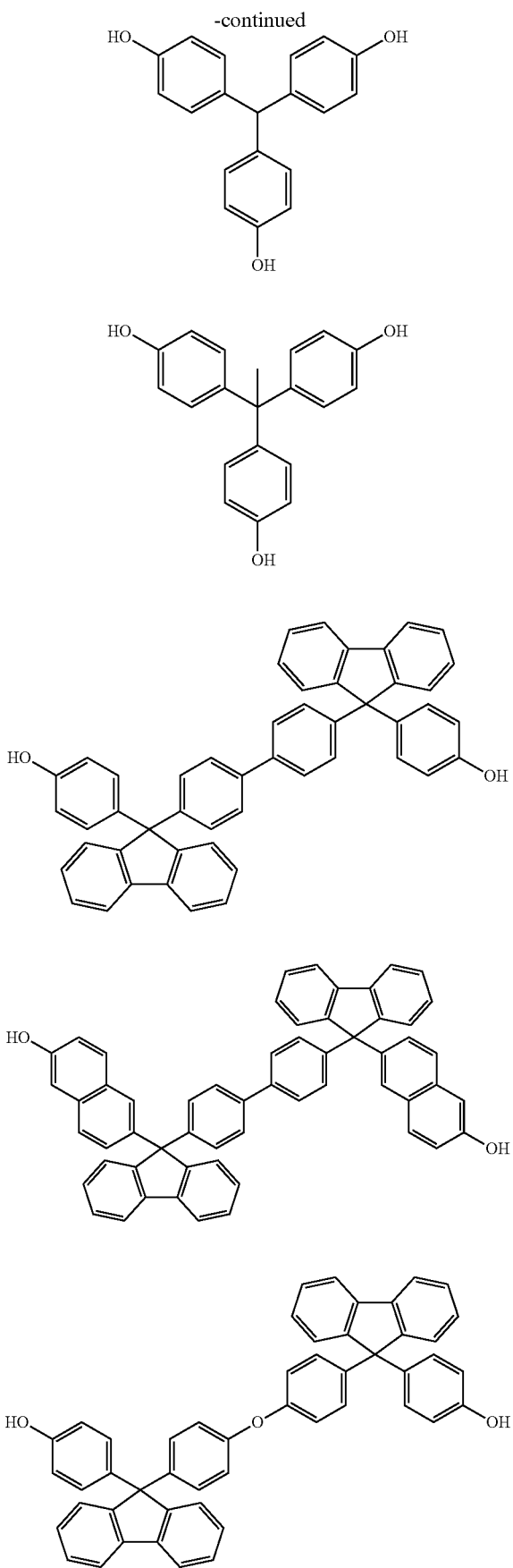
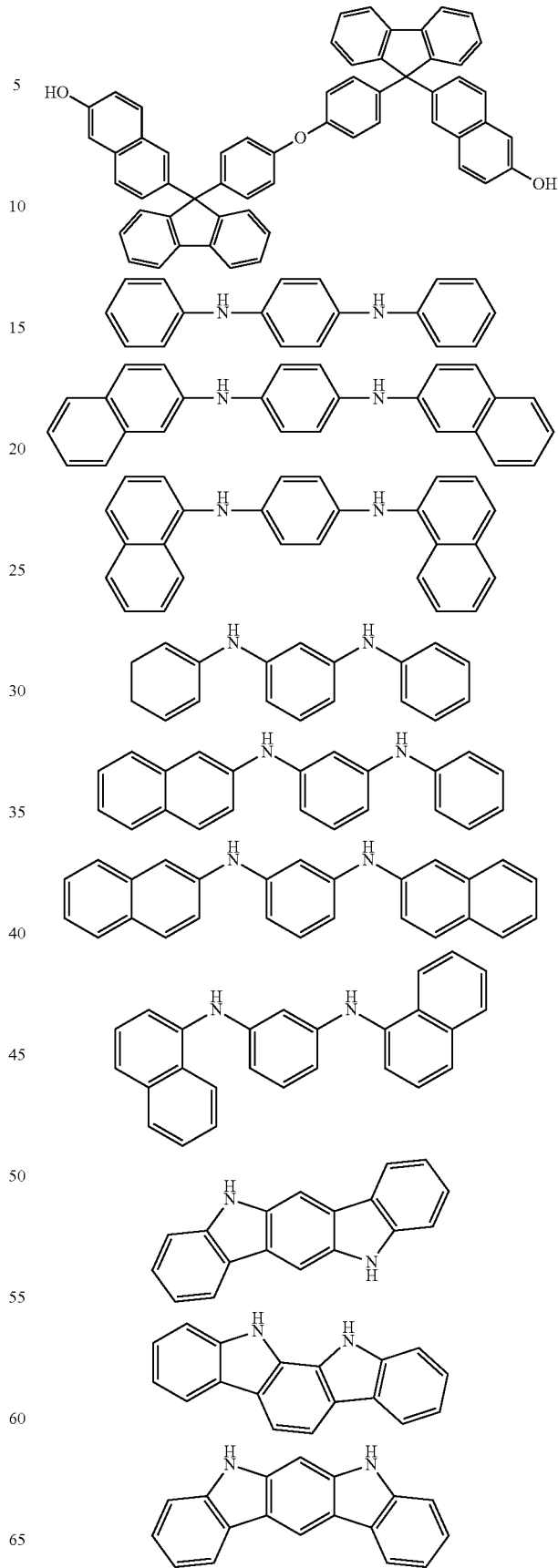

-continued
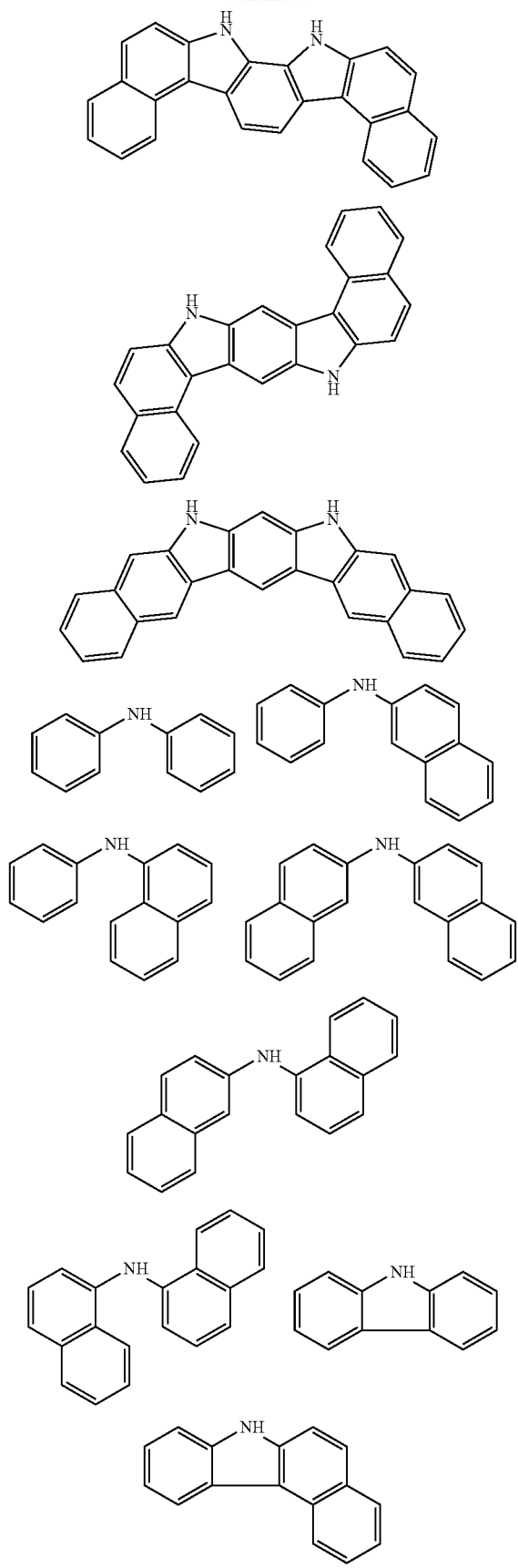
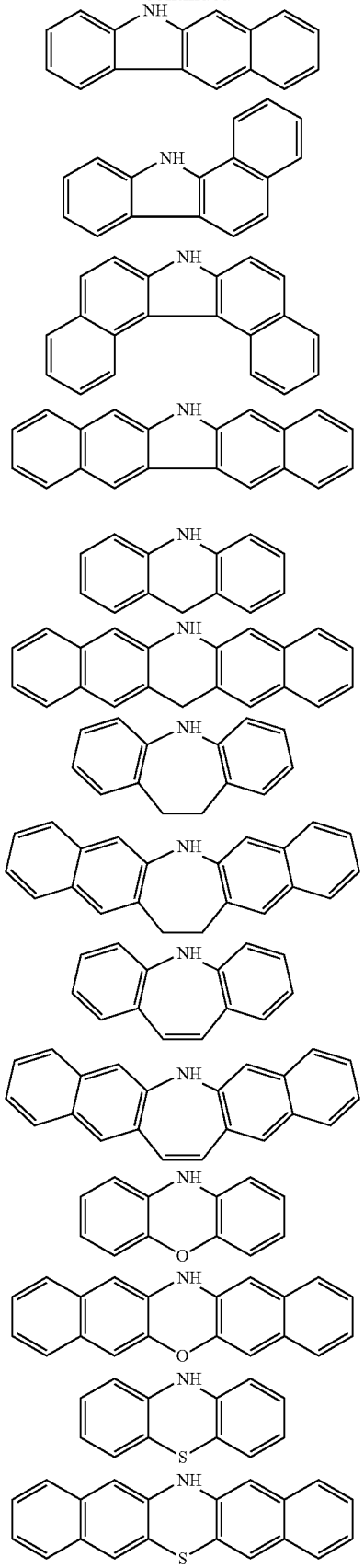

In the present invention, the polymer preferably further has a partial structure shown by (1C):

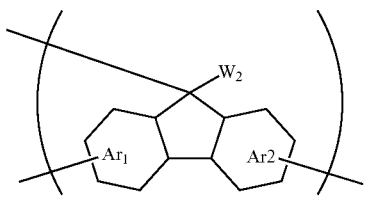
(1C)

where $W_2$ represents a monovalent organic group having 1 to 50 carbon atoms; and $Ar_1$ and Ar2 are as defined above.

Examples of the $W_2$ in the general formula (1C) include alkyl groups having 1 to 10 carbon atoms, an ethynyl group, a propargyl group, the following structures, etc. When $W_2$ has an aromatic ring, the aromatic ring optionally has a substituent thereon, such as a hydroxyl group, an alkyl group having 1 to 10 carbon atoms, an alkyloxy group having 1 to 10 carbon atoms, a vinyl group, an ethynyl group, an ethynylphenyl group, an allyl group, a propargyl group, or an aryl group. Above all, ones having a propargyl group or a naphthyl group are preferable from the viewpoints of imparting etching resistance and solvent solubility.

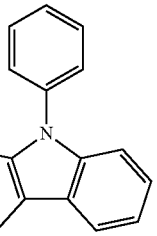

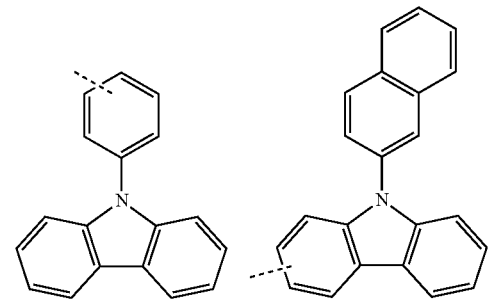

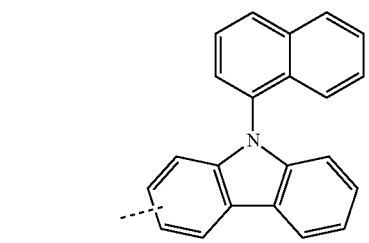

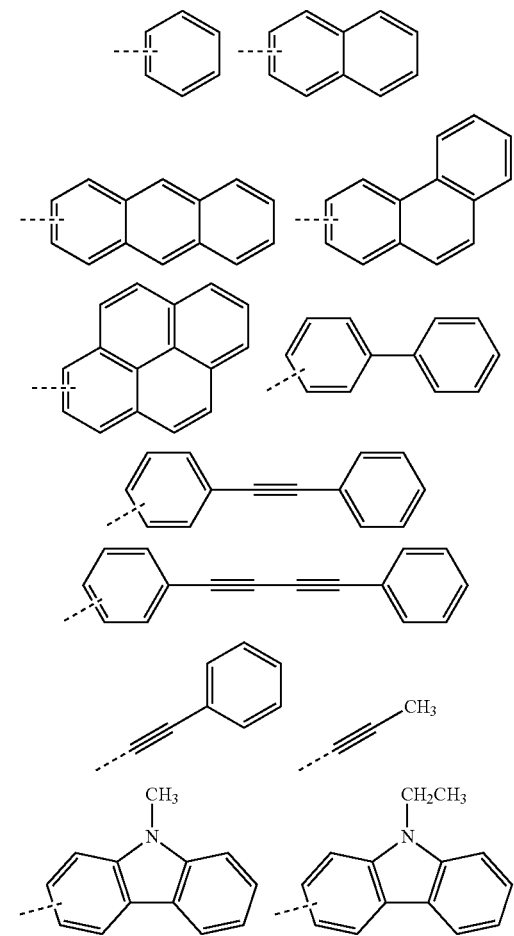

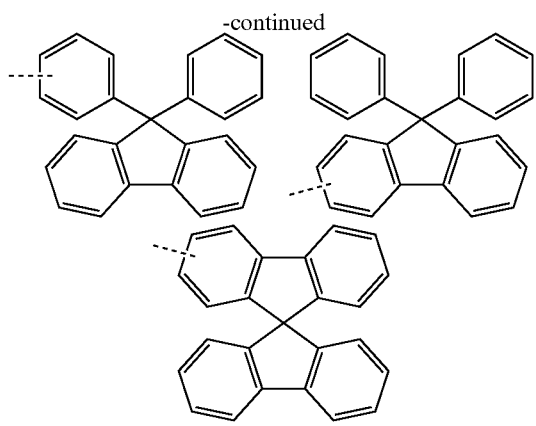

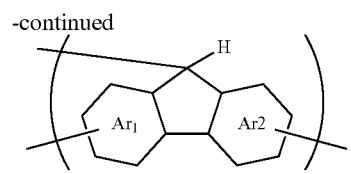

Further, the polymer preferably has a weight-average molecular weight (Mw) of 500 to 5000, and the Mw is more preferably 600 to 4000.

With such a molecular weight, the solubility in the organic solvent can be guaranteed, and the generation of sublimation product can be suppressed during baking. Moreover, the composition for forming an organic film has favorable thermal flowability. Accordingly, the composition for forming an organic film can not only favorably fill a fine structure formed on a substrate but also form an organic film while planarizing the entire substrate. Note that, in the present invention, the weight-average molecular weight is a polystyrene-based value determined by GPC (gel permeation chromatography) measurement using THF (tetrahydrofuran) as an eluent.

[Polymer Production Method]

As an example of a method of producing the inventive polymer shown by the general formula (1A), an electrophilic substitution reaction to a fluorene ring accompanied by dehydration can be exemplified as shown below in which a fluorenol having a tertiary alcohol group is used as a monomer. In the following scheme, $Ar_1$ and $Ar2$ are as defined above.

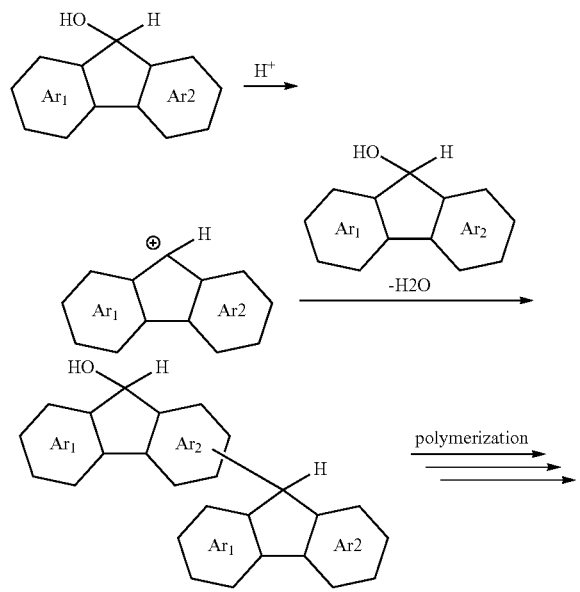

The polymer can be obtained generally in an organic solvent in the presence of an acid catalyst at room temperature or under cooling or heating as necessary. Examples of the acid catalyst to be used include inorganic acids such as hydrochloric acid, hydrobromic acid, sulfuric acid, nitric acid, phosphoric acid, and heteropoly acid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium(IV) ethoxide, titanium(IV) isopropoxide, and titanium (IV) oxide.

The solvent to be used is not particularly limited. Examples thereof include alcohols such as methanol, ethanol, isopropyl alcohol, butanol, ethylene glycol, propylene glycol, diethylene glycol, glycerol, ethylene glycol monomethyl ether, and propylene glycol monomethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; and non-protic polar solvents such as dimethylsulfoxide, N,N-dimethylformamide, and hexamethylphosphoric triamide. These can be used alone or in mixture of two or more.

The reaction method include a method in which a fluorenol and an acid catalyst are charged at once; a method in which a fluorenol is dispersed or dissolved, and then a catalyst is added at once or intermittently; a method in which a catalyst is diluted with a solvent and then added dropwise; a method in which a catalyst is dispersed or dissolved, and then a fluorenol is added at once or intermittently; and a method in which a fluorenol is diluted with a solvent and added dropwise. After completion of the reaction, the resultant may be diluted with an organic solvent and then subjected to liquid separation and washing to remove the catalyst having been used for the reaction and to collect the target product.

The organic solvent used in this event is not particularly limited, as long as it is capable of dissolving the target product and being separated into two layers when mixed with water. Examples of the organic solvent include hydrocarbons such as hexane, heptane, benzene, toluene, and xylene; esters such as ethyl acetate, n-butyl acetate, and propylene glycol methyl ether acetate; ketones such as methyl ethyl ketone, methyl amyl ketone, cyclohexanone, and methyl isobutyl ketone; ethers such as diethyl ether, diisopropyl ether, methyl-tert-butyl ether, and ethylcyclopentylmethyl ether; chlorinated solvents such as methylene chloride, chloroform, dichloroethane, and trichloroethylene; mixtures thereof; and the like. As the water used for washing in this event, generally, what is called deionized water or ultrapure water may be used. The washing may be performed once or more, preferably approximately once to five times, because washing ten times or more does not always produce the full washing effects thereof.

In the liquid separation and washing, the washing may be performed with a basic aqueous solution to remove acidic components in the system. Specific examples of the base include hydroxides of alkaline metals, carbonates of alkaline metals, hydroxides of alkali earth metals, carbonates of alkali earth metals, ammonia, organic ammonium, etc.

Further, in the liquid separation and washing, the washing may be performed with an acidic aqueous solution to remove metal impurities or basic components in the system. Specific examples of the acid include inorganic acids such as hydrochloric acid, hydrobromic acid, sulfuric acid, nitric acid, phosphoric acid, and heteropoly acid; organic acids such as oxalic acid, fumaric acid, maleic acid, trifluoroacetic acid, methanesulfonic acid, benzenesulfonic acid, p-toluenesulfonic acid, and trifluoromethanesulfonic acid; etc.

The liquid separation and washing may be performed with any one of the basic aqueous solution and the acidic aqueous solution, or can be performed with a combination of the two. The liquid separation and washing is preferably performed with the basic aqueous solution and the acidic aqueous solution in this order from the viewpoint of removing the metal impurities.

After the liquid separation and washing with the basic aqueous solution and/or acidic aqueous solution, washing with neutral water may be successively performed. This washing may be performed once or more, preferably approximately once to five times. As the neutral water, deionized water, ultrapure water, or the like as mentioned above may be used. The washing may be performed once or more, but if the washing is not performed sufficiently, the basic components and the acidic components may not be removed in some cases. The washing is performed preferably approximately once to five times because washing ten times or more does not always produce the full washing effects.

Further, the reaction product after the liquid separation operation can also be collected as a powder by concentrating and drying the solvent or crystallizing the reaction product under reduced pressure or normal pressure. Alternatively, the reaction product can be retained in a solution state with an appropriate concentration to improve the workability in preparing an organic film composition. The concentration at this point is preferably 0.1 to 50 mass %, more preferably 0.5 to 30 mass %. With such a concentration, the viscosity is hardly increased, making it possible to prevent degradation of the workability; in addition, since the amount of the solvent is not excessive, the solution can be prepared economically.

The solvent in this event is not particularly limited, as long as it is capable of dissolving the polymer. Specific examples of the solvent include ketones such as cyclohexanone and methyl-2-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These can be used alone or in mixture of two or more.

The inventive polymer having a partial structure shown by the general formula (1B) can be produced by a method in which a raw-material fluorenol for producing the polymer having a partial structure shown by the general formula (1A) is copolymerized with a compound having the partial structure with W1; a method in which during the reaction of the polymer having a partial structure shown by the general formula (1A), a compound having the partial structure with $W_1$ is added to cap the end; or other methods. In the following scheme, $Ar_1$, Ar2, and W1 are as defined above. In the case where $W_1$ is a hydroxyl group or an alkyloxy group, water or alcohol may be added into the reaction system in advance, or water or alcohol may be added during the reaction, so that the inventive polymer having a partial structure shown by the general formula (1B) can be produced.

(Copolymerization Method)

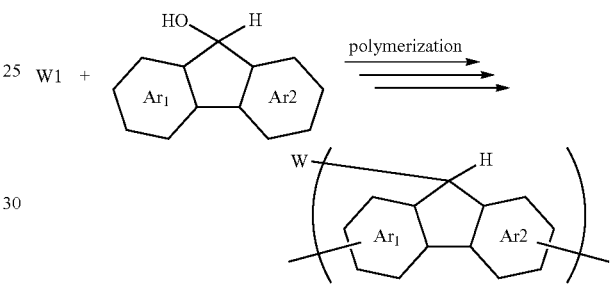

(End-Capping Method)

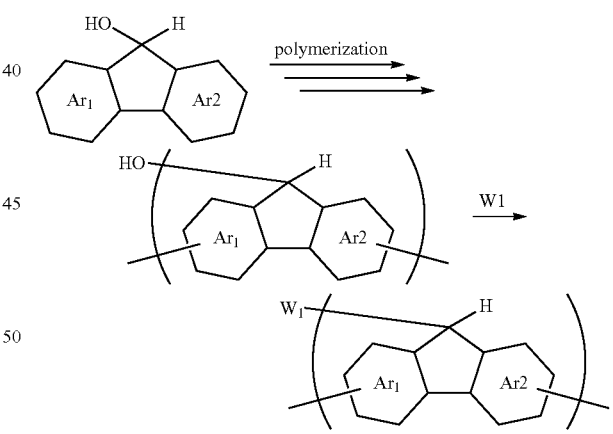

In the case where a compound having the organic group having one or more aromatic rings as $W_1$ is used to carry out the above reactions, the compound having the partial structure with $W_1$ acts as an end-capping agent for the fluorenol polymer while the polymerization proceeds. When the reaction takes place, there is a possibility that the aromatic ring(s) of the compound having the partial structure with $W_1$ may react with fluorenol polymers having different chain lengths as follows. Nevertheless, in the present invention, the polymer is depicted as in the general formula (1B) for convenience. Ar1 and Ar2 are as defined above, and n1, n2, and n3 each represent an integer of 1 or more.

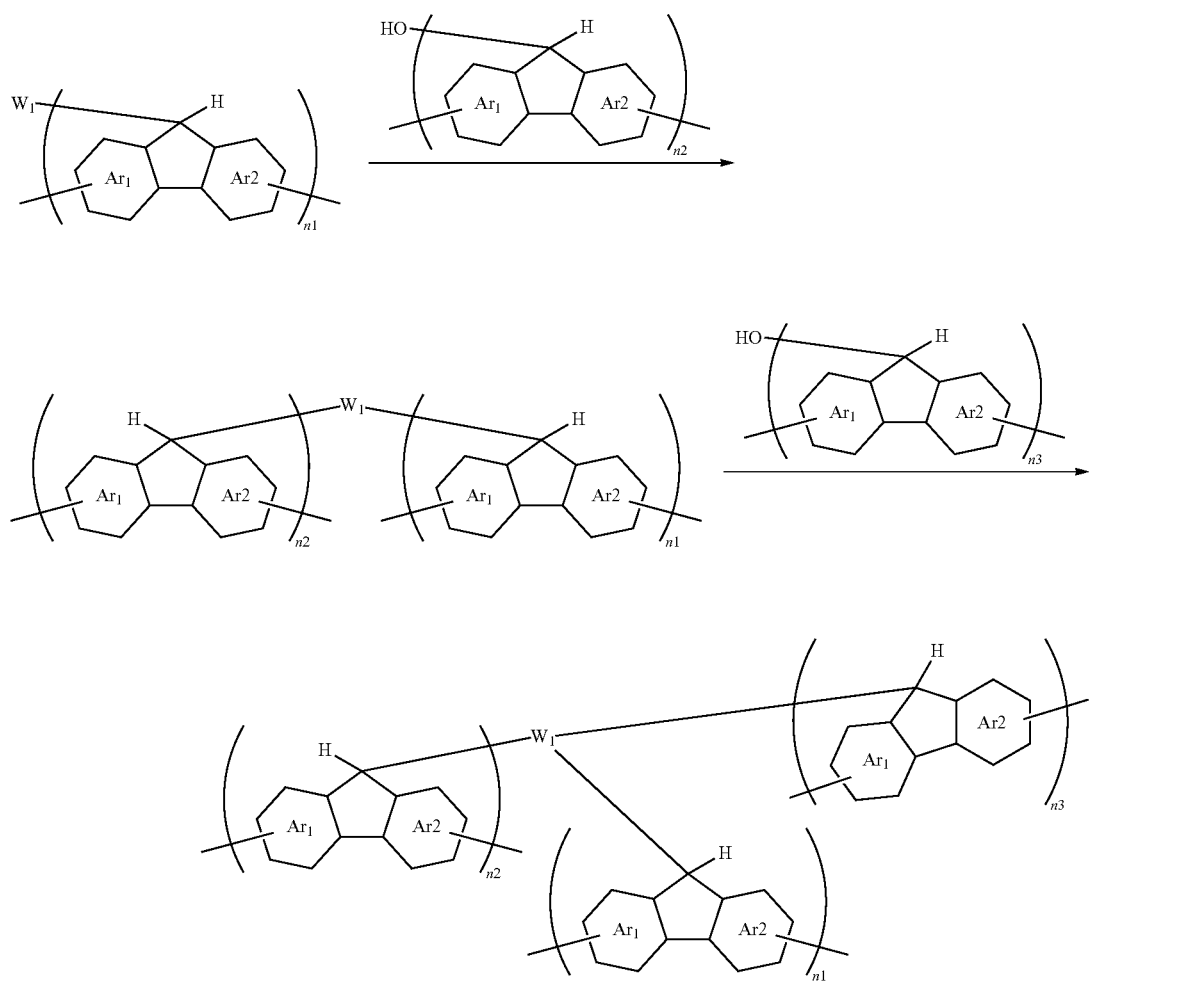

The reaction and collection methods for the polymer having a partial structure shown by the general formula (1B) are the same as the reaction and collection methods for the polymer having a partial structure shown by the general formula (1A).

The method for producing the inventive polymer having a partial structure shown by the general formula (1C) includes: a method in which the fluorenol which is used as the raw-material for producing the polymer having a partial structure shown by the general formula (1A) and a fluorenol having the partial structure with $W_2$ are charged at once and copolymerized; a method in which the fluorenol which is used as the raw-material for the polymer having a partial structure shown by the general formula (1A) or a fluorenol having the partial structure with $W_2$ is polymerized at the first stage, and then a different fluorenol from that at the first stage is added and polymerized at the second stage; etc. Additionally, when the polymerizations are performed at the two stages, a mixture of multiple fluorenols may be used in the polymerization at the first or second stage. Furthermore, the same or different fluorenol may be further added and polymerized at the third stage and the fourth stage. Moreover, in these polymerizations, the partial structure with $W_1$ can be introduced by using the compound having the partial structure with $W_1$ through the copolymerization or end capping.

(Copolymerization Method)

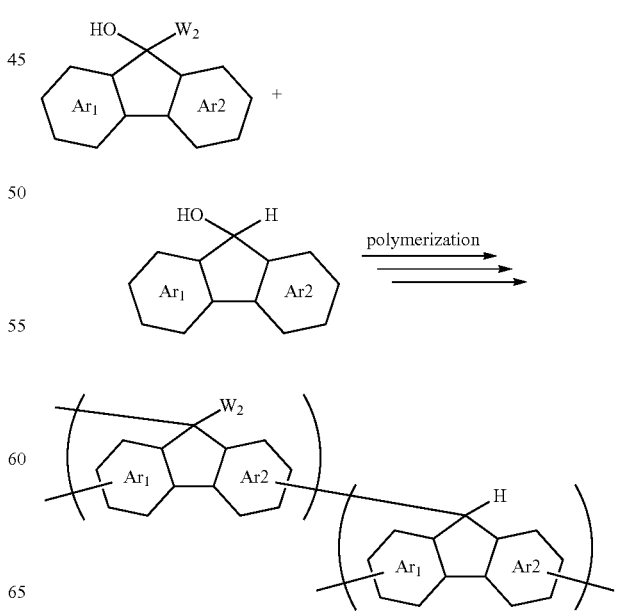

(Multi-Stage Polymerization Method)

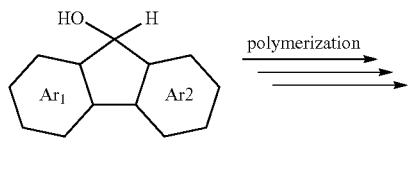

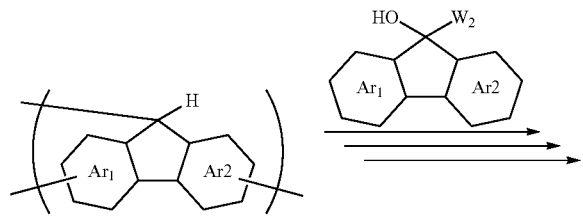

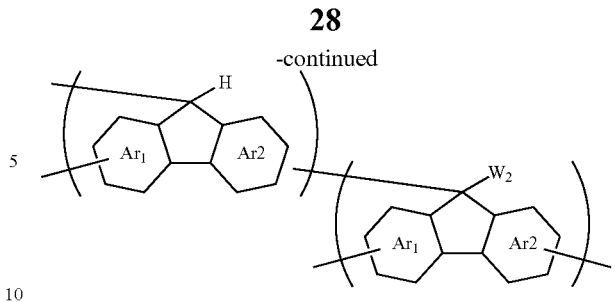

As in the reaction between a fluorenol and a compound having the organic group having one or more aromatic rings as $W_1$, there is a possibility in the above polymerizations that fluorenol polymers generated during the multiple polymerizations may react on the aromatic rings of $Ar_1$ and $Ar_2$ of a fluorenol having $W_2$ as a partial structure, as shown in the following scheme, for example. Nevertheless, in the present invention, the polymer is depicted as in the chemical formula (1C) for convenience. $Ar_1$ and $Ar_2$ are as defined above, and n1, n2, and n3 each represent an integer of 1 or more.

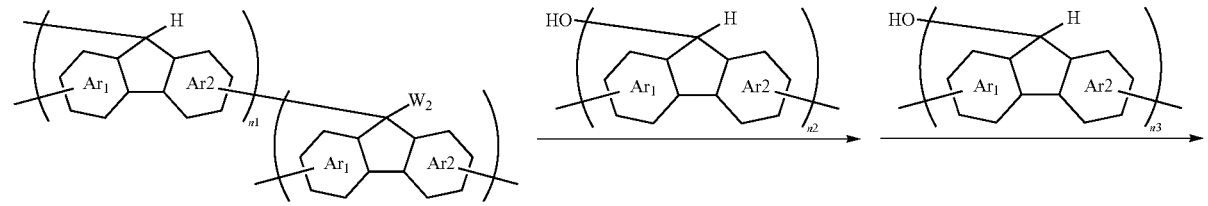

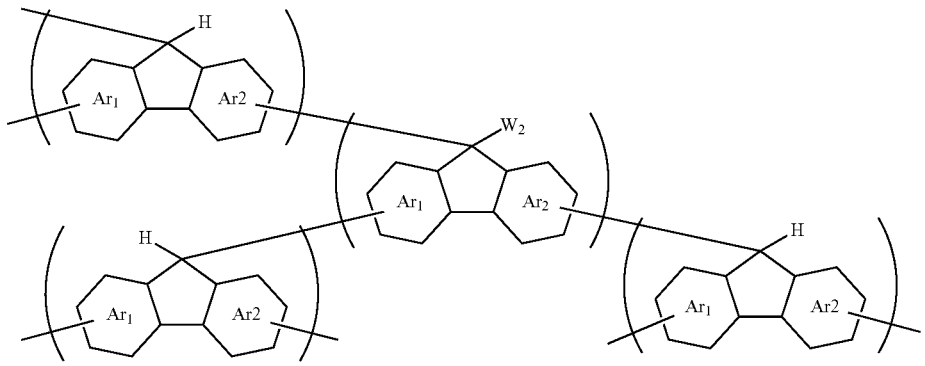

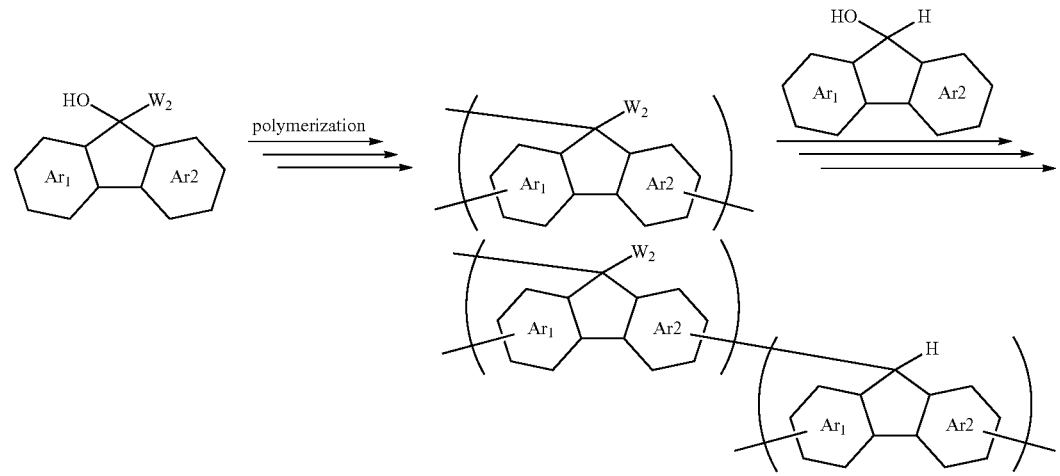

The reaction and collection methods for this polymer are the same as the reaction and collection methods for the polymer having a partial structure shown by the general formula (1A).

In the polymerizing for the inventive polymer having a partial structure shown by the general formula (1A), the raw-material fluorenol may be combined with a fluorenol having $W_1$ or $W_2$ on the partial structure, depending on the required performances. Specifically, a side chain structure for improving planarizing property and a rigid aromatic ring structure for improving etching resistance and heat resistance may be introduced into the structure of the fluorenol having $W_1$ or $W_2$ on the partial structure for use. The raw materials can be combined at a certain ratio in accordance with the required performances. Moreover, the methods of producing the polymers can also be selected according to the required performances. By appropriately selecting the copolymerization, multi-stage polymerization, or end-capping method, the structure of the polymers such as random or alternating polymer can be controlled. The composition for forming an organic film using these polymers can achieve all of filling and planarizing properties, heat resistance, twisting resistance, and etching resistance at high levels.

As described above, when the inventive polymer having a partial structure shown by the general formula (1A) is used in a composition for forming an organic film, the composition enables high etching resistance and excellent twisting resistance.

<Composition for Forming Organic Film>

The present invention further provides a composition for forming an organic film, containing: the polymer having a partial structure shown by the general formula (1A); and an organic solvent. Note that, in the inventive composition for forming an organic film, the inventive polymer having a partial structure shown by the general formula (1A) can be used alone or in combination with other types thereof.

The inventive composition for forming an organic film may be further blended with a modifier such as a blend compound or another polymer. The modifier mixed with the inventive composition for forming an organic film serves to improve the film-formability with spin coating and the filling property for a stepped substrate. Examples of such a modifier include novolak resins of phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-tert-butylphenol, 3-tert-butylphenol, 4-tert-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-tert-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-tert-butyl-5-methylphenol, pyrogallol, thymol, isothymol, 4,4'-(9H-fluorene-9-ylidene)bisphenol, 2,2'dimethyl-4,4'-(9H-fluorene-9-ylidene)bisphenol, 2,2'diallyl-4,4'-(9H-fluorene-9-ylidene)bisphenol, 2,2'difluoro-4,4'-(9H-fluorene-9-ylidene)bisphenol, 2,2'diphenyl-4,4'-(9H-fluorene-9-ylidene)bisphenol, 2,2'dimethoxy-4,4'-(9H-fluorene-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, and 7-methoxy-2-naphthol, dihydroxynaphthalenes such as 1,5-dihydroxynaphthalene, 1,7-dihydroxynaphthalene, and 2,6-dihydroxynaphthalene, methyl 3-hydroxynaphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborna-2-ene, α-pinene, β-pinene, limonene, etc.; and polyhydroxystyrene, polystyrene, polyvinylnaphthalene, polyvinylanthracene, polyvinylcarbazole, polyindene, polyacenaphthylene, polynorbornene, polycyclodecene, polytetracyclododecene, polynortricyclene, poly(meth)acrylate, and copolymers thereof. It is also possible to blend a naphthol dicyclopentadiene copolymer disclosed in JP 2004-205685 A, a fluorene bisphenol novolak resin disclosed in JP 2005-128509 A, an acenaphthylene copolymer disclosed in JP 2005-250434 A, fullerene having a phenol group disclosed in JP 2006-227391 A, a bisphenol compound and a novolak resin thereof disclosed in JP 2006-293298 A, a novolak resin of an adamantane phenol compound disclosed in JP 2006-285095 A, a bisnaphthol compound and a novolak resin thereof disclosed in JP 2010-122656 A, a fullerene resin compound disclosed in JP 2008-158002 A, or the like. The modifier is blended in an amount of preferably 0 to 1,000 parts by mass, more preferably 0 to 500 parts by mass, based on 100 parts by mass of the inventive polymer having a partial structure shown by the general formula (1A).

[Organic Solvent]

The organic solvent usable in the inventive composition for forming an organic film is not particularly limited, as long as the organic solvent is capable of dissolving the polymer having a partial structure shown by the general formula (1A), an acid generator, a crosslinking agent, and other additives, for example. Specifically, a solvent having a boiling point of lower than 180° C. can be used, such as solvents disclosed in paragraphs (0091) to (0092) of JP 2007-199653 A. Above all, it is preferable to use propylene glycol monomethyl ether acetate, propylene glycol monomethyl ether, 2-heptanone, cyclopentanone, cyclohexanone, and a mixture of two or more thereof.

Such a composition can be applied by spin coating. Since the inventive polymer having a partial structure shown by the general formula (1A) as described above is incorporated, the composition for forming an organic film has favorable dry etching resistance as well as heat resistance and high filling and planarizing properties.

Further, in the inventive composition for forming an organic film, it is also possible to add, as a component of the organic solvent, a high-boiling-point solvent having a boiling point of 180° C. or higher to the above-described solvent having a boiling point of lower than 180° C. (a mixture of the solvent having a boiling point of lower than 180° C. and the solvent having a boiling point of 180° C. or higher). The high-boiling-point organic solvent is not particularly limited to hydrocarbons, alcohols, ketones, esters, ethers, chlorinated solvents, and so forth, as long as the high-boiling-point organic solvent is capable of dissolving the polymer having a partial structure shown by the general formula (1A). Specific examples of the high-boiling-point organic solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, ethylene glycol monohexyl ether, ethylene glycol mono-2- ethylhexyl ether, ethylene glycol monophenyl ether, ethylene glycol monobenzyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol monophenyl ether, diethylene glycol monobenzyl ether, diethylene glycol diethyl ether, diethylene glycol dibutyl ether, diethylene glycol butylmethyl ether, triethylene glycol dimethyl ether, triethylene glycol monomethyl ether, triethylene glycol-n-butyl ether, triethylene glycol butylmethyl ether, triethylene glycol diacetate, tetraethylene glycol dimethyl ether, dipropylene glycol monomethyl ether, dipropylene glycol mono-n-propyl ether, dipropylene glycol mono-n-butyl ether, tripropylene glycol dimethyl ether, tripropylene glycol monomethyl ether, tripropylene glycol mono-n-propyl ether, tripropylene glycol mono-n-butyl ether, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol diacetate, dipropylene glycol monomethyl ether acetate, dipropylene glycol methyl-n-propyl ether, dipropylene glycol methyl ether acetate, 1,4-butanediol diacetate, 1,3-butylene glycol diacetate, 1,6-hexanediol diacetate, triethylene glycol diacetate, γ-butyrolactone, dihexyl malonate, diethyl succinate, dipropyl succinate, dibutyl succinate, dihexyl succinate, dimethyl adipate, diethyl adipate, dibutyl adipate, etc. These may be used alone or in mixture.

The boiling point of the high-boiling-point solvent may be appropriately selected according to the temperature at which the composition for forming an organic film is heated. The boiling point of the high-boiling-point solvent to be added is preferably 180° C. to 300° C., more preferably 200° C. to 300° C. The boiling point of 180° C. or higher prevents the evaporation rate at baking (heating) from becoming excessive, which would otherwise occur if the boiling point is too low. Thus, sufficient thermal flowability can be obtained. Meanwhile, when the boiling point is 300° C. or less, the boiling point is not too high, so that the high-boiling-point solvent evaporates after baking and does not remain in the organic film. Thus, the organic film properties such as etching resistance are not affected.

When the high-boiling-point solvent is used, the high-boiling-point solvent is blended in an amount of preferably 1 to 30 parts by mass based on 100 parts by mass of the solvent having a boiling point of lower than 180° C. The high-boiling-point solvent in such a formulation amount prevents a failure in providing sufficient thermal flowability during baking, and degradation of the film properties such as etching resistance, which would otherwise occur if the high-boiling-point solvent remains in the organic film.

In such a composition for forming an organic film, the polymer having a partial structure shown by the general formula (1A) is provided with thermal flowability by adding the high-boiling-point solvent, so that the composition for forming an organic film has both high filling and planarizing properties.

[Other Additives]

In the inventive composition for forming an organic film, an acid generator can be added so as to further promote the curing reaction. The acid generator includes a material that generates an acid by thermal decomposition, and a material that generates an acid by light irradiation. Any acid generator can be added. Specifically, materials disclosed in paragraphs (0061) to (0085) of JP 2007-199653 A can be added, but the present invention is not limited thereto.

One kind of the acid generator, or a combination of two or more kinds thereof can be used. When the acid generator is added, the amount is preferably 0.05 to 50 parts by mass, more preferably 0.1 to 10 parts by mass, based on 100 parts by mass of the polymer having a partial structure shown by the general formula (1A).

To the inventive composition for forming an organic film, a surfactant can be added so as to improve the coating property in spin coating. As the surfactant, for example, those disclosed in (0142) to (0147) of JP 2009-269953 A can be used.

Moreover, to the inventive composition for forming an organic film, a crosslinking agent can also be added so as to increase the curability and to further suppress intermixing with an upper layer film. The crosslinking agent is not particularly limited, and known various types of crosslinking agents can be widely used. Examples thereof include melamine-based crosslinking agents, glycoluril-based crosslinking agents, benzoguanamine-based crosslinking agents, urea-based crosslinking agents, β-hydroxyalkylamide-based crosslinking agents, isocyanurate-based crosslinking agents, aziridine-based crosslinking agents, oxazoline-based crosslinking agents, and epoxy-based crosslinking agents.

Specific examples of the melamine-based crosslinking agents include hexamethoxymethylated melamine, hexabutoxymethylated melamine, alkoxy- and/or hydroxy-substituted derivatives thereof, and partial self-condensates thereof. Specific examples of the glycoluril-based crosslinking agents include tetramethoxymethylated glycoluril, tetrabutoxymethylated glycoluril, alkoxy- and/or hydroxy-substituted derivatives thereof, and partial self-condensates thereof. Specific examples of the benzoguanamine-based crosslinking agents include tetramethoxymethylated benzoguanamine, tetrabutoxymethylated benzoguanamine, alkoxy- and/or hydroxy-substituted derivatives thereof, and partial self-condensates thereof. Specific examples of the urea-based crosslinking agents include dimethoxymethylated dimethoxyethyleneurea, alkoxy- and/or hydroxy-substituted derivatives thereof, and partial self-condensates thereof. A specific example of the β-hydroxyalkylamide-based crosslinking agents includes N,N,N',N'-tetra(2-hydroxyethyl)adipic acid amide. Specific examples of the isocyanurate-based crosslinking agents include triglycidyl isocyanurate and triallyl isocyanurate. Specific examples of the aziridine-based crosslinking agents include 4,4'-bis(ethyleneiminocarbonylamino)diphenylmethane and 2,2-bishydroxymethylbutanol-tris[3-(1-aziridinyl)propionate]. Specific examples of the oxazoline-based crosslinking agents include 2,2'-isopropylidenebis(4-benzyl-2-oxazoline), 2,2'-isopropylidenebis(4-phenyl-2-oxazoline), 2,2'-methylenebis4,5-diphenyl-2-oxazoline, 2,2'-methylenebis-4-phenyl-2-oxazoline, 2,2'-methylenebis-4-tert-butyl-2-oxazoline, 2,2'-bis(2-oxazoline), 1,3-phenylenebis(2-oxazoline), 1,4-phenylenebis(2-oxazoline), and a 2-isopropenyloxazoline copolymer. Specific examples of the epoxy-based crosslinking agents include diglycidyl ether, ethylene glycol diglycidyl ether, 1,4-butanediol diglycidyl ether, 1,4-cyclohexanedimethanol diglycidyl ether, poly(glycidyl methacrylate), trimethylolethane triglycidyl ether, trimethylolpropane triglycidyl ether, and pentaerythritol tetraglycidyl ether.

Further, to the inventive composition for forming an organic film, a plasticizer can be added so as to further improve the planarizing and filling properties. The plasticizer is not particularly limited, and known various types of plasticizers can be widely used. Examples thereof include low-molecular-weight compounds such as phthalic acid esters, adipic acid esters, phosphoric acid esters, trimellitic acid esters, and citric acid esters; and polymers such as polyethers, polyesters, and polyacetal-based polymers disclosed in JP 2013-253227 A.

Further, like the plasticizer, as an additive for imparting the filling and planarizing properties to the inventive composition for forming an organic film, it is preferable to use, for example, liquid additives having polyethylene glycol or polypropylene glycol structure, or thermo-decomposable polymers having a weight loss ratio between 30° C. and 250° C. of 40 mass % or more and a weight-average molecular weight of 300 to 200,000. The thermo-decomposable polymers preferably contain a repeating unit having an acetal structure shown by the following general formula (DP1) or (DP1a).

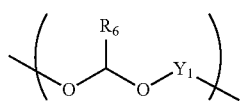
(DP1)

In the formula, $R_6$ represents a hydrogen atom or a saturated or unsaturated monovalent organic group having 1 to 30 carbon atoms which may be substituted. $Y_1$ represents a saturated or unsaturated divalent organic group having 2 to 30 carbon atoms.

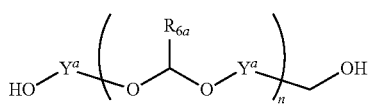
(DP1a)

In the formula, $R_{ha}$ represents an alkyl group having 1 to 4 carbon atoms. $Y^a$ represents a saturated or unsaturated divalent hydrocarbon group having 4 to 10 carbon atoms which may have an ether bond. "n" represents an average repeating unit number of 3 to 500.

Note that one kind of the inventive composition for forming an organic film can be used, or two or more kinds thereof can be used in combination. The composition for forming an organic film can be used as a resist underlayer film material or a planarizing material for manufacturing a semiconductor device.

Moreover, the inventive composition for forming an organic film is quite useful as a resist underlayer film material for multilayer resist processes such as a two-layer resist process, a three-layer resist process using a silicon-containing middle layer film, and a four-layer resist process using a silicon-containing inorganic hard mask middle layer film and an organic antireflective coating.

<Method for Forming Organic Film>

The present invention provides a method for forming an organic film by using the above-described composition for forming an organic film. The resulting organic film serves as a resist underlayer film in a multilayer resist film used in lithography or a flat film for manufacturing a semiconductor.

In the inventive method for forming an organic film, a substrate to be processed is coated with the composition for forming an organic film by a spin coating method etc. By employing a method like spin coating method, favorable filling property can be obtained. After the spin coating, baking (heating) is performed to evaporate the solvent and to promote the crosslinking reaction, thereby preventing the mixing with a resist upper layer film or a resist middle layer film. The baking is preferably performed at 100° C. or more and 600° C. or less within 10 to 600 seconds, more preferably at 200° C. or more and 500° C. or less within 10 to 300 seconds. In considering the influences of device damage and wafer deformation, the upper limit of the heating temperature in lithographic wafer process is preferably 600° C. or less, more preferably 500° C. or less.

Moreover, in the inventive method for forming an organic film, after a substrate to be processed is coated with the inventive composition for forming an organic film by the spin coating method or the like as described above, an organic film can be formed by curing the composition for forming an organic film by baking in an atmosphere with an oxygen concentration of 0.1% or more and 21% or less.

A sufficiently cured organic film can be obtained by baking the inventive composition for forming an organic film in such an oxygen atmosphere. The atmosphere during the baking may be in air. Nevertheless, it is preferable to introduce an inert gas such as $N_2$, Ar, or He to reduce oxygen amount from the viewpoint of preventing oxidation of the organic film. To prevent the oxidation, the oxygen concentration needs to be controlled, and is preferably 1000 ppm or less, more preferably 100 ppm or less. Preventing the oxidation of the organic film during baking is preferable because an increase in absorption and a decrease in etching resistance are prevented.

Such an inventive method for forming an organic film demonstrates excellent filling and planarizing performances and thus can provide a flat organic film regardless of unevenness of a substrate to be processed. Accordingly, the inventive method is quite useful in forming a flat organic film on a substrate to be processed which has a structure or a step with a height of 30 nm or more.

Note that the thickness of the organic film such as a resist underlayer film or a flat film for manufacturing a semiconductor device is appropriately determined and preferably 30 to 20,000 nm, more preferably 50 to 15,000 nm.

(Patterning Processes)

The present invention provides a patterning process according to a three-layer resist process using such a composition for forming an organic film. The patterning process is a method for forming a pattern in a substrate to be processed, and includes at least the following steps:

forming an organic film by using the inventive composition for forming an organic film on a substrate to be processed;

forming a silicon-containing resist underlayer film by using a resist underlayer film material containing silicon on the organic film;

forming a resist upper layer film by using a photoresist composition on the silicon-containing resist underlayer film;

forming a circuit pattern in the resist upper layer film;

transferring the pattern to the silicon-containing resist underlayer film by etching using the resist upper layer film having the formed circuit pattern as a mask;

transferring the pattern to the organic film by etching using the silicon-containing resist underlayer film having the transferred pattern as a mask; and forming the pattern in the body to be processed by etching using the organic film having the transferred pattern as a mask.

The silicon-containing resist underlayer film in this three-layer resist process exhibits etching resistance to an oxygen gas or a hydrogen gas. Thus, when the organic film is dry-etched using the silicon-containing resist underlayer film as a mask in the three-layer resist process, the dry etching is preferably performed using an etching gas mainly containing an oxygen gas or a hydrogen gas.

As the silicon-containing resist underlayer film in the 3-layer resist process, a polysiloxane-based underlayer film is also preferably used. The silicon-containing resist underlayer film having antireflective effect can suppress the reflection. Particularly, for 193-nm light exposure, a material containing many aromatic groups and having high etching selectivity relative to the substrate is used as an organic film, so that the k-value and thus the substrate reflection are increased; in contrast, the reflection can be suppressed by imparting absorption to the silicon-containing resist underlayer film so as to have an appropriate k-value, and the substrate reflection can be reduced to 0.5% or less. As the silicon-containing resist underlayer film having antireflective effect, a polysiloxane is preferably used which has anthracene for 248-nm and 157-nm light exposure, or a phenyl group or a light-absorbing group having a silicon-silicon bond for 193-nm light exposure in a pendant structure, and which is crosslinked by an acid or heat.

An organic antireflective coating (BARC) may be formed on the silicon-containing resist underlayer film. In this case, a pattern can be formed in a body to be processed through steps of:

forming an organic film by using the inventive composition for forming an organic film on a body to be processed;

forming a silicon-containing resist underlayer film by using a silicon-containing resist underlayer film material on the organic film;

forming a BARC on the silicon-containing resist underlayer film;

forming a resist upper layer film by using a photoresist composition on the BARC;

forming a circuit pattern in the resist upper layer film;

successively transferring the pattern to the BARC and the silicon-containing resist underlayer film by etching using the resist upper layer film having the formed circuit pattern as a mask;

transferring the pattern to the organic film by etching using the silicon-containing resist underlayer film having the transferred pattern as a mask; and etching the body to be processed using the organic film having the transferred pattern as a mask to form the pattern in the body to be processed.

Alternatively, an inorganic hard mask may be formed in place of the resist underlayer film. In this case, a pattern can be formed in a substrate to be processed through steps of:

forming an organic film by using the inventive composition for forming an organic film on a body to be processed;

forming an inorganic hard mask selected from a silicon oxide film, a silicon nitride film, and a silicon oxynitride film on the organic film;

forming a resist upper layer film by using a photoresist composition on the inorganic hard mask;

forming a circuit pattern in the resist upper layer film;

transferring the pattern to the inorganic hard mask by etching using the resist upper layer film having the formed circuit pattern as a mask;

transferring the pattern to the organic film by etching using the inorganic hard mask having the formed pattern as a mask; and etching the body to be processed using the organic film having the formed pattern as a mask to form the pattern in the body to be processed.

In the case where an inorganic hard mask is formed on the organic film as described above, a silicon oxide film, a silicon nitride film, and a silicon oxynitride film (SiON film) can be formed by a CVD method, an ALD method, or the like. The method for forming the silicon nitride film is disclosed in, for example, JP 2002-334869 A and WO 2004/066377 A1. The film thickness of the inorganic hard mask is preferably 5 to 200 nm, more preferably 10 to 100 nm. As the inorganic hard mask, a SiON film is most preferably used which is effective as an antireflective film. When the SiON film is formed, the substrate temperature reaches 300 to 500° C. Hence, the underlayer film needs to withstand the temperature of 300 to 500° C. Since the composition for forming an organic film used in the present invention has high heat resistance and can withstand high temperatures of 300° C. to 500° C., this enables the combination of the inorganic hard mask formed by a CVD method or an ALD method with the organic film formed by a spin coating method.

Moreover, the present invention is suitable for a four-layer resist process using BARC. In this case, a pattern can be formed in a body to be processed through steps of:

forming an organic film by using the inventive composition for forming an organic film on a body to be processed;

forming an inorganic hard mask selected from a silicon oxide film, a silicon nitride film, and a silicon oxynitride film on the organic film;

forming a BARC on the inorganic hard mask;

forming a resist upper layer film by using a photoresist composition on the BARC;

forming a circuit pattern in the resist upper layer film;

successively transferring the pattern to the BARC and the inorganic hard mask by etching using the resist upper layer film having the formed circuit pattern as a mask;

transferring the pattern to the organic film by etching using the inorganic hard mask having the formed pattern as a mask; and etching the body to be processed using the organic film having the formed pattern as a mask to form the pattern in the body to be processed.

Although a photoresist film may be formed as a resist upper layer film on an inorganic hard mask, it is also possible to form a BARC on the inorganic hard mask by spin coating and then form the photoresist film on the BARC as described above. Particularly, when a SiON film is used as the inorganic hard mask, two antireflective films including the SiON film and the BARC make it possible to suppress the reflection even in liquid immersion exposure at a high NA exceeding 1.0. Another merit of the BARC formation is having an effect of reducing trailing of the photoresist pattern immediately above the SiON film.

The resist upper layer film in the three-layer resist process may be a positive type or a negative type, and any generally-used photoresist composition can be employed. After spin coating of the photoresist composition, pre-baking is preferably performed within ranges of 60 to 180° C. and 10 to 300 seconds. Then, light exposure, post-exposure bake (PEB), and development are performed according to conventional methods to obtain the resist pattern. Note that the thickness of the resist upper layer film is not particularly limited, but is preferably 30 to 500 nm, particularly preferably 50 to 400 nm.

In addition, the exposure light includes high energy beam with a wavelength of 300 nm or less; specifically, excimer laser of 248 nm, 193 nm, or 157 nm, soft X-ray of 3 to 20 nm, electron beam, X-ray, etc.

In the inventive patterning processes, a photolithography with a wavelength of 10 nm or more and 300 nm or less, direct lithography with electron beam, nanoimprinting, or a combination thereof is preferably employed as the method for forming the circuit pattern in the resist upper layer film.

Moreover, in the inventive patterning processes, alkali development or organic solvent development is preferably employed as the development method.

Next, using the resulting resist pattern as a mask, etching is performed. In the three-layer resist process, the silicon-containing resist underlayer film and the inorganic hard mask are etched using a fluorocarbon-based gas and the upper layer resist pattern as the mask. Thereby, a silicon-containing resist underlayer film pattern and an inorganic hard mask pattern are formed.

Next, using the obtained silicon-containing resist underlayer film pattern and inorganic hard mask pattern as masks, the organic film is processed by etching.

Subsequently, the body to be processed (e.g. substrate to be processed) can be etched according to a conventional method. For example, the substrate to be processed made of $SiO_2$, SiN, or silica-based low-dielectric insulating film is etched mainly with a fluorocarbon-based gas; and p-Si, Al, or W is etched mainly with a chlorine- or bromine-based gas. When the substrate is processed by etching with a fluorocarbon-based gas, the silicon-containing resist underlayer film pattern in the three-layer resist process is removed when the substrate is processed. When the substrate is etched with a chlorine- or bromine-based gas, the silicon-containing resist underlayer film pattern needs to be removed by additional dry etching with a fluorocarbon-based gas after the substrate processing.

The organic film obtained from the inventive composition for forming an organic film is characterized by excellent etching resistance when the substrate to be processed is etched as described above.

In the inventive patterning processes, as the body to be processed, it is preferable to use a semiconductor device substrate, a metal film, a metal carbide film, a metal oxide film, a metal nitride film, a metal oxycarbide film, or a metal oxynitride film.

Further, as the metal, it is preferable to use silicon, titanium, tungsten, hafnium, zirconium, chromium, germanium, copper, silver, gold, aluminum, indium, gallium, arsenic, palladium, iron, tantalum, iridium, molybdenum, or an alloy thereof.

Note that the substrate to be processed is not particularly limited, and examples thereof include substrates made of Si, α-Si, p-Si, $SiO_2$, SiN, SiON, W, TiN, Al, or the like; these substrates coated with a layer to be processed; etc. Examples of the layer to be processed include various Low-k films made of Si, $SiO_2$, SiON, SiN, p-Si, α-Si, W, W—Si, Al, Cu, Al—Si, or the like; and stopper films thereof. Generally, the layer can be formed to have a thickness of preferably 50 to 10,000 nm, more preferably 100 to 5,000 nm. Note that when the layer to be processed is formed, the substrate and the layer to be processed are formed from different materials.

Furthermore, it is preferable to use the substrate to be processed which has a structure or step with a height of 30 nm or more.

Hereinbelow, an example of the three-layer resist process will be specifically described with reference to FIG. 1.

As shown in FIG. 1(A), in the three-layer resist process, an organic film 3 is formed by using the inventive composition for forming an organic film on a layer 2 to be processed which has been stacked on a substrate 1. Then, a silicon-containing resist underlayer film 4 is formed, and a resist upper layer film 5 is formed thereon.

Next, as shown in FIG. 1(B), a predetermined portion 6 of the resist upper layer film is exposed to light, followed by PEB and development to form a resist pattern 5a (FIG. 1(C)). Using the resulting resist pattern 5a as a mask, the silicon-containing resist underlayer film 4 is etched with a CF-based gas. Thereby, a silicon-containing resist underlayer film pattern 4a is formed (FIG. 1(D)). After the resist pattern 5a is removed, the organic film 3 is etched with oxygen plasma using the resulting silicon-containing resist underlayer film pattern 4a as a mask. Thereby, an organic film pattern 3a is formed (FIG. 1(E)). Further, after the silicon-containing resist underlayer film pattern 4a is removed, the layer 2 to be processed is etched using the organic film pattern 3a as a mask. Thus, a pattern 2a is formed (FIG. 1(F)).

When an inorganic hard mask is used, the inorganic hard mask is formed in place of the silicon-containing resist underlayer film 4. When a BARC is formed, the BARC layer is disposed between the silicon-containing resist underlayer film 4 or the inorganic hard mask and the resist upper layer film 5. The etching of the BARC starts before the etching of the silicon-containing resist underlayer film 4, but these etchings may be performed continuously. Alternatively, after the BARC is etched alone, for example, the etching apparatus is changed, and then the etching of the silicon-containing resist underlayer film 4 may be started.

As described above, the inventive patterning processes make it possible to precisely form a fine pattern in a substrate to be processed in the multilayer resist processes.

EXAMPLE

Hereinafter, the present invention will be specifically described by referring to Examples and Comparative Examples. However, the present invention is not limited to these descriptions.

Polymers (A1) to (A8) incorporated into compositions for forming an organic film were synthesized using the following Fluorenols (B1) to (B4) and Aromatic-containing Compounds (referred as Armatic Compounds hereinafter) (C1) to (C3).

Fluorenols:

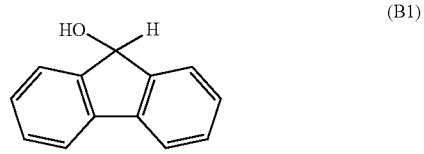

(B1)

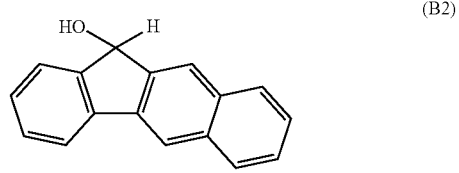

(B2)

(B3)

(B4)

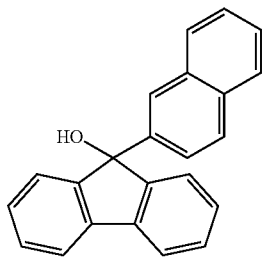

Aromatic Compounds:

(C1)

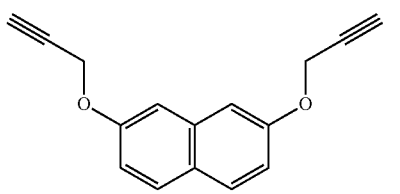

(C2)

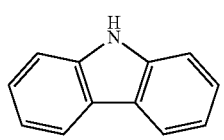

(C3)

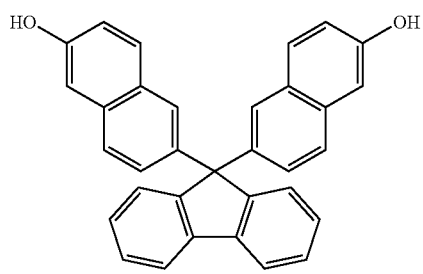

When multiple fluorenols were used to synthesize a polymer, the ratio of the fluorenols thus fed was expressed using "m" and "1" as in the following formulae.

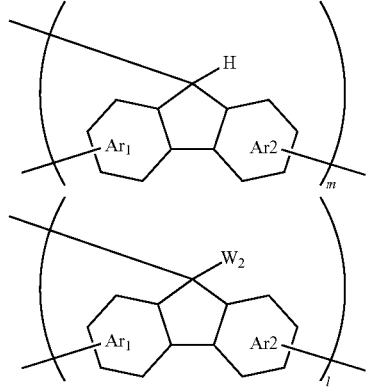

Synthesis Example 1

Under a nitrogen atmosphere, 200 g of 1,2-dichloroethane was added to 30.0 g of Fluorenol (B1) to prepare a homogeneous solution with an inner temperature of 50° C. Then, 15.8 g of methanesulfonic acid was slowly added thereto for the reaction with an inner temperature of 70° C. for 8 hours. After cooling to room temperature, 500 g of toluene was added, and the resultant was washed six times with 100 g of pure water. The organic layer was evaporated under reduced pressure to dryness. To the residue, 100 g of THF (tetrahydrofuran) was added to form a homogeneous solution, followed by crystallization with 300 g of methanol. The precipitated crystal was separated by filtration, washed twice with 200 g of methanol, and collected. The collected crystal was vacuum dried at 70° C. Thus, Polymer (A1) shown by the following formula was obtained. The weight-average molecular weight (Mw) and dispersity (Mw/Mn) of Polymer (A1) were determined in terms of polystyrene by GPC measurement using THF as an eluent. The results were Mw=2600 and Mw/Mn=1.68.

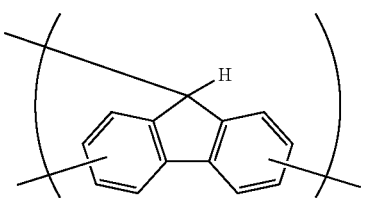

Synthesis Example 2

Under a nitrogen atmosphere, 200 g of 1,2-dichloroethane was added to 30.0 g of Fluorenol (B2) to prepare a homogeneous solution with an inner temperature of 50° C. Then, 12.4 g of methanesulfonic acid was slowly added thereto for the reaction with an inner temperature of 70° C. for 8 hours. After cooling to room temperature, 500 g of toluene was added, and the resultant was washed six times with 100 g of pure water. The organic layer was evaporated under reduced pressure to dryness. To the residue, 100 g of THF was added to form a homogeneous solution, followed by crystallization with 300 g of methanol. The precipitated crystal was separated by filtration, washed twice with 200 g of methanol, and collected. The collected crystal was vacuum dried at 70° C. Thus, Polymer (A2) shown by the following formula was obtained. The weight-average molecular weight (Mw) and dispersity (Mw/Mn) of Polymer (A2) were determined in terms of polystyrene by GPC measurement using THF as an eluent. The results were Mw=2900 and Mw/Mn=1.58.

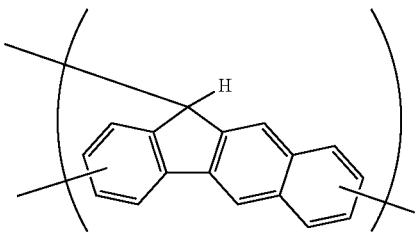

Synthesis Example 3

Under a nitrogen atmosphere, 200 g of 1,2-dichloroethane was added to 30.0 g of Fluorenol (B1) and 0.30 g of water to prepare a homogeneous solution with an inner temperature of 50° C. Then, 15.8 g of methanesulfonic acid was slowly added thereto for the reaction with an inner temperature of 70° C. for 8 hours. After cooling to room temperature, 500 g of toluene was added, and the resultant was washed six times with 100 g of pure water. The organic layer was evaporated under reduced pressure to dryness. To the residue, 100 g of THF was added to form a homogeneous solution, followed by crystallization with 300 g of methanol. The precipitated crystal was separated by filtration, washed twice with 200 g of methanol, and collected. The collected crystal was vacuum dried at 70° C. Thus, Polymer (A3) shown by the following formula was obtained. The weight-average molecular weight (Mw) and dispersity (Mw/Mn) of Polymer (A3) were determined in terms of polystyrene by GPC measurement using THF as an eluent. The results were Mw=1800 and Mw/Mn=1.49.

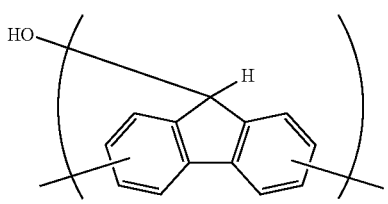

Synthesis Example 4

Under a nitrogen atmosphere, 200 g of 1,2-dichloroethane was added to 30.0 g of Fluorenol (B1) and 3.89 g of Aromatic Compound (C1) to prepare a homogeneous solution with an inner temperature of 50° C. Then, 15.8 g of methanesulfonic acid was slowly added thereto for the reaction with an inner temperature of 70° C. for 8 hours. After cooling to room temperature, 500 g of toluene was added, and the resultant was washed six times with 100 g of pure water. The organic layer was evaporated under reduced pressure to dryness. To the residue, 100 g of THF was added to form a homogeneous solution, followed by crystallization with 300 g of methanol. The precipitated crystal was separated by filtration, washed twice with 200 g of methanol, and collected. The collected crystal was vacuum dried at 70° C. Thus, Polymer (A4) shown by the following formula was obtained. The weight-average molecular weight (Mw) and dispersity (Mw/Mn) of Polymer (A4) were determined in terms of polystyrene by GPC measurement using THF as an eluent. The results were Mw=1520 and Mw/Mn=1.48.

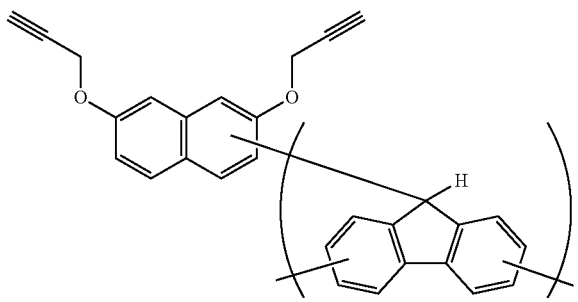

Synthesis Example 5

Under a nitrogen atmosphere, 200 g of 1,2-dichloroethane was added to 30.0 g of Fluorenol (B1) and 2.75 g of Aromatic Compound (C2) to prepare a homogeneous solution with an inner temperature of 50° C. Then, 15.8 g of methanesulfonic acid was slowly added thereto for the reaction with an inner temperature of 70° C. for 8 hours. After cooling to room temperature, 500 g of toluene was added, and the resultant was washed six times with 100 g of pure water. The organic layer was evaporated under reduced pressure to dryness. To the residue, 100 g of THF was added to form a homogeneous solution, followed by crystallization with 300 g of methanol. The precipitated crystal was separated by filtration, washed twice with 200 g of methanol, and collected. The collected crystal was vacuum dried at 70° C. Thus, Polymer (A5) shown by the following formula was obtained. The weight-average molecular weight (Mw) and dispersity (Mw/Mn) of Polymer (A5) were determined in terms of polystyrene by GPC measurement using THF as an eluent. The results were Mw=1420 and Mw/Mn=1.53.

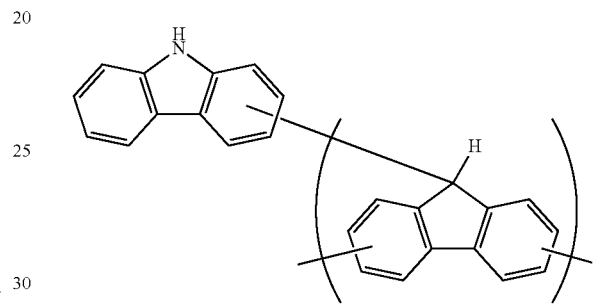

Synthesis Example 6

Under a nitrogen atmosphere, 200 g of 1,2-dichloroethane was added to 30.0 g of Fluorenol (B2) and 5.82 g of Aromatic Compound (C3) to prepare a homogeneous solution with an inner temperature of 50° C. Then, 12.4 g of methanesulfonic acid was slowly added thereto for the reaction with an inner temperature of 70° C. for 8 hours. After cooling to room temperature, 500 g of toluene was added, and the resultant was washed six times with 100 g of pure water. The organic layer was evaporated under reduced pressure to dryness. To the residue, 100 g of THF was added to form a homogeneous solution, followed by crystallization with 300 g of methanol. The precipitated crystal was separated by filtration, washed twice with 200 g of methanol, and collected. The collected crystal was vacuum dried at 70° C. Thus, Polymer (A6) shown by the following formula was obtained. The weight-average molecular weight (Mw) and dispersity (Mw/Mn) of Polymer (A6) were determined in terms of polystyrene by GPC measurement using THF as an eluent. The results were Mw=1720 and Mw/Mn=1.38.

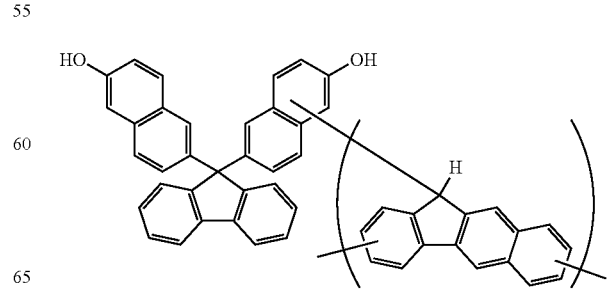

Synthesis Example 7

Under a nitrogen atmosphere, 200 g of 1,2-dichloroethane was added to 15.0 g of Fluorenol (B1) and 18.1 g of Fluorenol (B3) to prepare a homogeneous solution with an inner temperature of 50° C. Then, 15.8 g of methanesulfonic acid was slowly added thereto for the reaction with an inner temperature of 70° C. for 8 hours. After cooling to room temperature, 500 g of toluene was added, and the resultant was washed six times with 100 g of pure water. The organic layer was evaporated under reduced pressure to dryness. To the residue, 100 g of THF was added to form a homogeneous solution, followed by crystallization with 300 g of methanol. The precipitated crystal was separated by filtration, washed twice with 200 g of methanol, and collected. The collected crystal was vacuum dried at 70° C. Thus, Polymer (A7) shown by the following formula was obtained. The weight-average molecular weight (Mw) and dispersity (Mw/Mn) of Polymer (A7) were determined in terms of polystyrene by GPC measurement using THF as an eluent. The results were Mw=2430 and Mw/Mn=1.74.

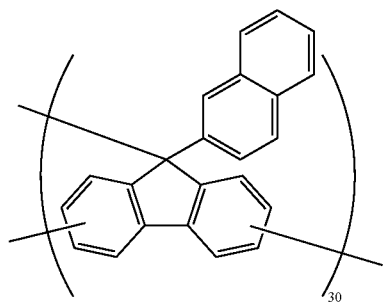

Synthesis Example 8

Under a nitrogen atmosphere, 100 g of 1,2-dichloroethane was added to 10.0 g of Fluorenol (B4) to prepare a homogeneous solution with an inner temperature of 50° C. Then, 15.8 g of methanesulfonic acid was slowly added thereto for the reaction with an inner temperature of 70° C. for 4 hours. After the inner temperature was cooled to 50° C., a homogeneous mixture solution containing 21.0 g of Fluorenol (B2) and 100 g of 1,2-dichloroethane prepared in advance was slowly added dropwise. The inner temperature was raised to 70° C. again for the reaction to proceed for 8 hours. After cooling to room temperature, 500 g of toluene was added, and the resultant was washed six times with 100 g of pure water. The organic layer was evaporated under reduced pressure to dryness. To the residue, 100 g of THF was added to form a homogeneous solution, followed by crystallization with 300 g of methanol. The precipitated crystal was separated by filtration, washed twice with 200 g of methanol, and collected. The collected crystal was vacuum dried at 70° C. Thus, Polymer (A8) shown by the following formula was obtained. The weight average molecular weight (Mw) and dispersity (Mw/Mn) of Polymer (A8) were determined in terms of polystyrene by GPC measurement using THF as an eluent. The results were Mw=2930 and Mw/Mn=1.61.

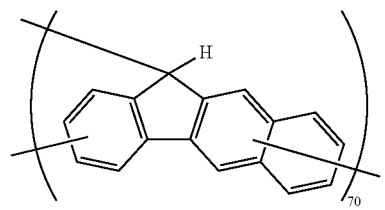

Comparative Synthesis Example

Under a nitrogen atmosphere, 18.0 g of 9-fluorenone was added to 12.8 g of naphthalene, and the temperature was raised to 230° C. for the reaction for 8 hours. Immediately after the reaction started, 0.25 ml of methanesulfonic acid was added to the reaction solution once every hour, i.e., eight times in total. After cooling to room temperature, 40 g of toluene was added to the reaction solution, the resultant was washed six times with pure water, and the organic layer was evaporated under reduced pressure to dryness. To the residue, 100 g of THF (tetrahydrofuran) was added to form a homogeneous solution, followed by crystallization with 300 g of methanol. The precipitated crystal was separated by filtration, washed twice with 200 g of methanol, and collected. The collected crystal was vacuum dried at 70° C. Thus, Polymer (R1) shown by the following formula was obtained. The weight-average molecular weight (Mw) and dispersity (Mw/Mn) of Polymer (R1) were determined in terms of polystyrene by GPC measurement using THF as an eluent. The results were Mw=2130 and Mw/Mn=2.61.

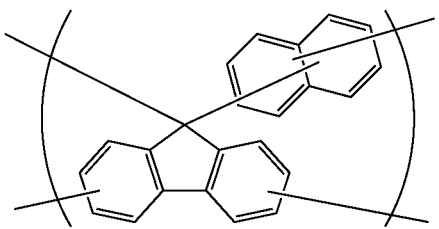

Table 1 shows a list of the structural formulae of Polymers (A1) to (A8) used in Examples and Polymer (R1) used in Comparative Examples as well as the results of Mw and Mw/Mn.

TABLE 1
| Synthesis Example | Polymer | Mw | Mw/Mn |
|---|---|---|---|
| 1 | 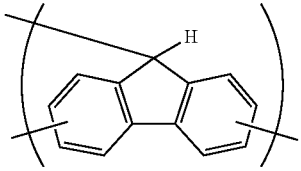 (A1) | 2600 | 1.68 |
| 2 | 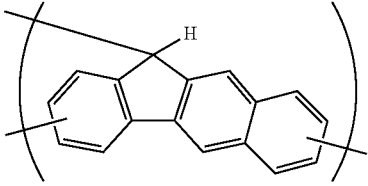 (A2) | 2900 | 1.58 |
| 3 | 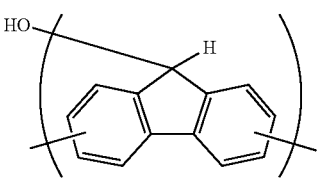 (A3) | 1800 | 1.49 |
| 4 | 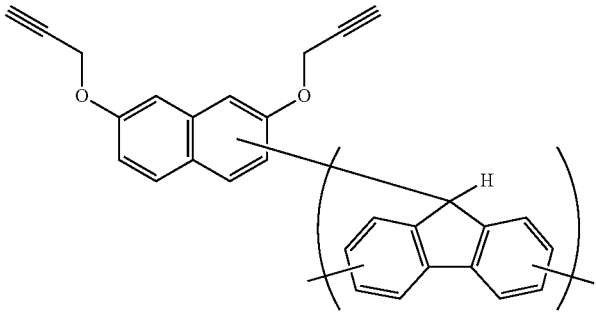 (A4) | 1520 | 1.48 |
| 5 | 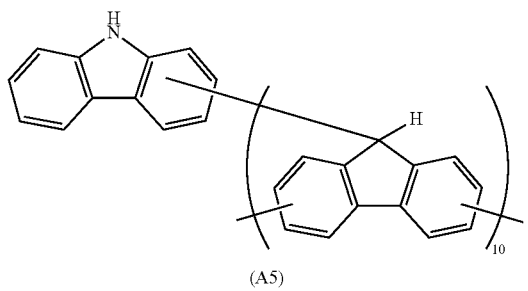 (A5) | 1420 | 1.53 |

TABLE 1-continued

| Synthesis Example | Polymer | Mw | Mw/Mn |
|---|---|---|---|
| 6 | 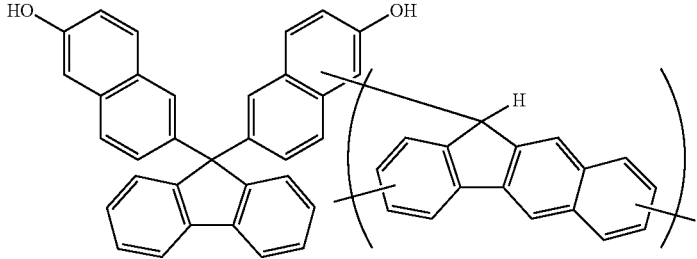 (A6) | 1720 | 1.38 |
| 7 | 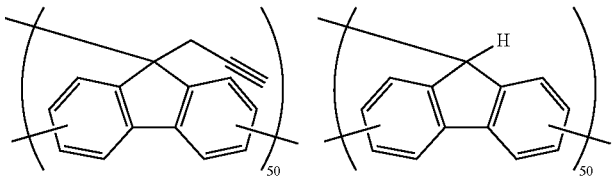 (A7) | 2430 | 1.74 |
| 8 | 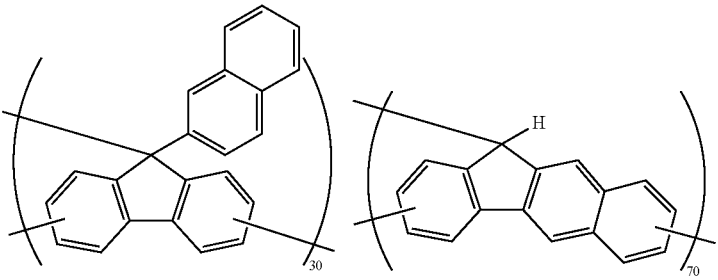 (A8) | 2930 | 1.61 |
| Comparative Synthesis Example 1 | 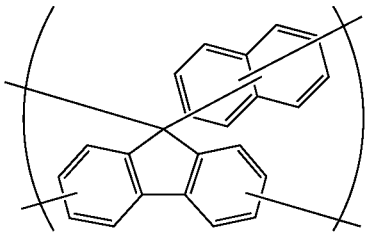 (R1) | 2130 | 2.61 |

Preparation of Compositions (UDL-1 to -12, Comparative UDL-1 and -2) for Forming Organic Film Polymers (A1) to (A8) and (R1) described above were dissolved in proportions shown in Table 2 using propylene glycol monomethyl ether acetate (PGMEA) or cyclohexanone (CyHO), both of which contained 0.1 mass % FC-4430 (manufactured by Sumitomo 3M Ltd.), and optionally using (S1) 1,6-diacetoxyhexane (boiling point: 260° C.) and (S2) tripropylene glycol monomethyl ether (boiling point: 242° C.) as high-boiling-point solvents. The solutions were filtered through a 0.1-μm filter made of a fluorinated resin to prepare compositions (UDL-1 to -12, Comparative UDL-1 and -2) for forming an organic film. Note that an acid generator (AG) and a crosslinking agent (XL) shown by the following formulae were used in UDL for Comparative Example.

TABLE 2

| Composition for forming organic film | Polymer (1) (parts by mass) | Polymer (2) (parts by mass) | Additive (parts by mass) | High-boiling-point solvent (parts by mass) | Solvent (parts by mass) |
|---|---|---|---|---|---|
| UDL-1 | A1 (10) | — | — | — | PGMEA (45) CyHO (45) |
| UDL-2 | A2 (10) | — | — | — | PGMEA (45) CyHO (45) |
| UDL-3 | A3 (10) | — | — | — | PGMEA (90) |
| UDL-4 | A4 (10) | — | — | — | PGMEA (90) |
| UDL-5 | A5 (10) | — | — | — | PGMEA (90) |
| UDL-6 | A6 (10) | — | — | — | PGMEA (90) |
| UDL-7 | A7 (10) | — | — | — | PGMEA (90) |
| UDL-8 | A8 (10) | — | — | — | PGMEA (90) |
| UDL-9 | A1 (5) | A4 (5) | — | — | PGMEA (90) |
| UDL-10 | A2 (5) | A8 (5) | — | — | PGMEA (90) |
| UDL-11 | A1 (10) | — | — | S1 (10) | PGMEA (40) CyHO (40) |
| UDL-12 | A3 (10) | — | — | S2 (10) | PGMEA (80) |
| Comparative UDL-1 | R1 (10) | — | — | — | CyHO (90) |
| Comparative UDL-2 | R1 (10) | — | AG (0.5) XL (0.5) | — | CyHO (90) |

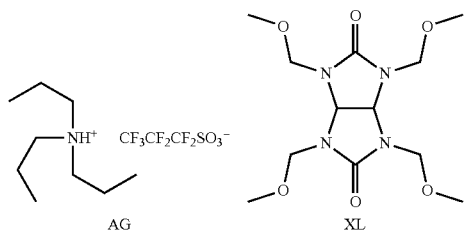

AG                XL

Examples 1-1 to 1-12, Comparative Examples 1-1 and 1-2 (Solvent Resistance Measurement)

UDL-1 to -12 and Comparative UDL-1 and -2 were each applied onto a silicon substrate and baked in the atmosphere at 350° C. for 60 seconds. Then, the film thickness was measured. A PGMEA solvent was dispensed on the film and allowed to stand for 30 seconds. The resultant was spin dried and baked at 100° C. for 60 seconds to evaporate the PGMEA. The film thickness was measured to find the film thicknesses before and after the PGMEA treatment. The film thickness after the film formation and the film thickness after the PGMEA treatment were used to determine a film remaining percentage. Table 3 shows the result.

TABLE 3

| | Composition for forming organic film | Film thickness after film formation : a (Å) | Film thickness after PGMEA treatment: b (Å) | b/a × 100 (%) |
|---|---|---|---|---|
| Example 1-1 | UDL-1 | 2019 | 2014 | 99.8 |
| Example 1-2 | UDL-2 | 1990 | 1989 | 99.9 |
| Example 1-3 | UDL-3 | 2004 | 1998 | 99.7 |
| Example 1-4 | UDL-4 | 1999 | 1991 | 99.6 |
| Example 1-5 | UDL-5 | 2009 | 2003 | 99.7 |
| Example 1-6 | UDL-6 | 2010 | 2006 | 99.8 |
| Example 1-7 | UDL-7 | 2004 | 2002 | 99.9 |
| Example 1-8 | UDL-8 | 2001 | 1998 | 99.9 |
| Example 1-9 | UDL-9 | 1993 | 1991 | 99.9 |
| Example 1-10 | UDL-10 | 1992 | 1989 | 99.8 |
| Example 1-11 | UDL-11 | 2005 | 2001 | 99.8 |
| Example 1-12 | UDL-12 | 2005 | 1999 | 99.7 |
| Comparative Example 1-1 | Comparative UDL-1 | 1998 | 1370 | 68.6 |
| Comparative Example 1-2 | Comparative UDL-2 | 2000 | 1981 | 99.1 |

As shown in Table 3, the film remaining percentages after the PGMEA treatment on the organic films (Examples 1-1 to 1-12) using the inventive polymers were 99% or more. This indicates that the crosslinking reaction took place by heating, and sufficient solvent resistance was exhibited. In contrast, since Comparative UDL-1 using Polymer (R1) had no crosslinkable moiety, the polymer alone did not exhibit solvent resistance. In order for solvent resistance to be exhibited, the acid generator and the crosslinking agent need to be added. These results indicate that the partial structures of the inventive polymers effectively function as thermal-crosslinking groups.

Examples 2-1 to 2-12, Comparative Examples 2-1 and 2-2 (Hardness Measurement)

UDL-1 to -12 and Comparative UDL-1 and -2 were each applied onto a silicon substrate and baked in the atmosphere at 350° C. for 60 seconds to form an organic film having a film thickness of 200 nm. Such organic films were subjected to a nano-indentation test with a SA2 nanoindenter instrument manufactured by TOYO Corporation, and the hardnesses of the organic films were measured. Table 4 shows the result.

TABLE 4

| | Composition for forming organic film | Hardness (GPa) |
|---|---|---|
| Example 2-1 | UDL-1 | 0.65 |
| Example 2-2 | UDL-2 | 0.69 |
| Example 2-3 | UDL-3 | 0.66 |
| Example 2-4 | UDL-4 | 0.68 |
| Example 2-5 | UDL-5 | 0.63 |
| Example 2-6 | UDL-6 | 0.64 |
| Example 2-7 | UDL-7 | 0.68 |
| Example 2-8 | UDL-8 | 0.70 |
| Example 2-9 | UDL-9 | 0.66 |
| Example 2-10 | UDL-10 | 0.69 |
| Example 2-11 | UDL-11 | 0.64 |
| Example 2-12 | UDL-12 | 0.66 |
| Comparative Example 2-1 | Comparative UDL-1 | 0.45 |
| Comparative Example 2-2 | Comparative UDL-2 | 0.48 |

As shown in Table 4, the hardnesses of Examples 2-1 to 2-12 were higher than those of Comparative Examples 2-1 and 2-2. This verified that the inventive polymers are capable of forming finer and stronger organic films than those formed from Polymer (R1) used in Comparative UDL-1 and -2. This results from the fact that the inventive polymers are thermosetting. Hence, the cured organic films obtained therefrom can form fine organic films constituted of only condensed aromatic rings with high carbon density, consequently exhibiting high hardnesses. In contrast, Polymer (R1) used in Comparative Examples has high carbon density, but the polymer itself is not thermosetting. The resulting organic films did not have high hardness values. Moreover, although Polymer (R1) can exhibit solvent resistance by using the crosslinking agent, the crosslinking agent decreases the carbon density of the polymer. As a result, the cured organic films did not have high hardness.

Examples 3-1 to 3-12, Comparative Examples 3-1 and 3-2 (Etching Test)

[Etching Test with $CF_4/CHF_3$-Based Gas]

UDL-1 to -12 and Comparative UDL-1 and -2 were each applied onto a silicon substrate and baked in the atmosphere at 350° C. for 60 seconds to form an organic film having a film thickness of 200 nm. Then, an etching test was conducted with a $CF_4/CHF_3$-based gas under the following conditions. In this case, a dry etching apparatus TE-8500 manufactured by Tokyo Electron Limited was used to find a film thickness difference of each organic film before and after the etching. Table 5 shows the result.

The etching conditions were as follows.

| | |
|---|---|
| Chamber pressure | 40.0 Pa |
| RF power | 1,000 W |
| $CHF_3$ gas flow rate | 10 ml/min |
| $CF_4$ gas flow rate | 100 ml/min |
| He gas flow rate | 200 ml/min |
| Time | 20 sec |

TABLE 5

| | composition for forming organic film | Etching test with $CF_4/CHF_3$-based gas | | Etching test with $O_2$-based gas | |
|---|---|---|---|---|---|
| | | Film thickness reduction amount (A) | Film reduction ratio with Comparative Example 3-1 taken as 100% | Film thickness reduction amount (A) | Film reduction ratio with Comparative Example 3-1 taken as 100% |
| Example 3-1 | UDL-1 | 840 | 94% | 1188 | 94% |
| Example 3-2 | UDL-2 | 821 | 91% | 1172 | 92% |
| Example 3-3 | UDL-3 | 846 | 94% | 1196 | 94% |
| Example 3-4 | UDL-4 | 847 | 94% | 1190 | 94% |
| Example 3-5 | UDL-5 | 843 | 94% | 1181 | 93% |
| Example 3-6 | UDL-6 | 820 | 91% | 1183 | 93% |
| Example 3-7 | UDL-7 | 838 | 93% | 1165 | 92% |
| Example 3-8 | UDL-8 | 827 | 92% | 1159 | 91% |
| Example 3-9 | UDL-9 | 844 | 94% | 1179 | 93% |
| Example 3-10 | UDL-10 | 833 | 93% | 1167 | 92% |
| Example 3-11 | UDL-11 | 841 | 94% | 1192 | 94% |
| Example 3-12 | UDL-12 | 843 | 94% | 1191 | 94% |
| Comparative Example 3-1 | Comparative UDL-1 | 898 | 100% | 1270 | 100% |
| Comparative Example 3-2 | Comparative UDL-2 | 987 | 110% | 1413 | 111% |

Table 5 shows the film reduction ratio in each Example and Comparative Example, given that the thickness of the Comparative UDL-1 film reduced by the etching with $CF_4/CHF_3$-based gas is taken as 100. The smaller the ratio, the more excellent the etching resistance.

[Etching Test with $O_2$-Based Gas]

UDL-1 to -12 and Comparative UDL-1 and -2 were each applied onto a silicon substrate and baked in the atmosphere at 350° C. for 60 seconds to form an organic film having a film thickness of 200 nm. An etching test was conducted with an $O_2$-based gas under the following conditions. In this case, a dry etching apparatus TE-8500 manufactured by Tokyo Electron Limited was used to find a film thickness difference of each polymer film before and after the etching. Table 5 also shows this result.

The etching conditions were as follows.

| | |
|---|---|
| Chamber pressure | 40.0 Pa |
| RF power | 100 W |
| $O_2$ gas flow rate | 30 ml/min |
| $N_2$ gas flow rate | 70 ml/min |
| Time | 60 sec |

As in the case of the etching test with a $CF_4/CHF_3$-based gas, Table 5 shows the film reduction ratio in each Example and Comparative Example, given that the thickness of the Comparative UDL-1 film reduced by the etching with $O_2$-based gas is taken as 100. The smaller the ratio, the more excellent the etching resistance.

As shown in Table 5, the comparison between Examples 3-1 to 3-12 and Comparative Examples 3-1, 3-2 shows that, in both the etching tests with $CF_4/CHF_3$-based gas and $O_2$-based gas, the reduction amounts after the etching of the organic films in Examples 3-1 to 3-12 were smaller than the reduction amounts after the etching of the Comparative UDL-1 and -2 organic films. This indicates that the organic films excellent in etching resistance were formed in Examples 3-1 to 3-12. Moreover, the comparison between Comparative Examples 3-1 and 3-2 revealed that, in Comparative Example 3-2 in which the organic film was formed using the crosslinking agent, the addition of the crosslinking agent decreased the carbon content of the organic film and consequently impaired the etching resistance by approximately 10%. Further, Examples 3-1 to 3-12 using the inventive polymers were compared with Comparative Example 3-1 using Comparative Polymer (R1). Since fine organic films were formed by the thermal crosslinking in Examples 3-1 to 3-12 using the inventive polymers as suggested from the hardness measurement result, the reduction amounts of the organic film thicknesses after the etching were suppressed by 5% or more in comparison with Comparative Example 3-1. As a result, the organic films formed from the inventive compositions for forming an organic film were more excellent in etching resistance.

Examples 4-1 to 4-12, Comparative Examples 4-1 and 4-2 (Pattern Etching Test)

UDL-1 to -12 and Comparative UDL-1 and -2 were each applied onto a Si wafer substrate having a diameter of 300 mm on which a $SiO_2$ film with a film thickness of 200 nm had been formed. Then, a resist underlayer film was formed to have a film thickness of 200 nm after baking in the atmosphere at 350° C. for 60 seconds. A silicon-containing resist middle layer material (SOG-1) was applied onto the resist underlayer film and baked at 220° C. for 60 seconds to form a resist middle layer film having a film thickness of 35 nm. A resist upper layer film material (SL resist for ArF) was applied thereon and baked at 105° C. for 60 seconds to form a resist upper layer film having a film thickness of 100 nm. A liquid immersion top coat material (TC-1) was applied onto the resist upper layer film and baked at 90° C. for 60 seconds to form a top coat having a film thickness of 50 nm.

The resist upper layer film material (SL resist for ArF) was prepared by: dissolving 100 parts by mass of a polymer (RP1) shown by the following formula, 6.6 parts by mass of acid generator (PAG1) shown by the following formula, and 0.8 parts by mass of a basic compound (Amine1) shown by the following formula in 2500 parts by mass of PGMEA containing 0.1 mass % FC-430 (manufactured by Sumitomo 3M Ltd.); and filtering the solution through a 0.1-μm filter made of a fluorinated resin.

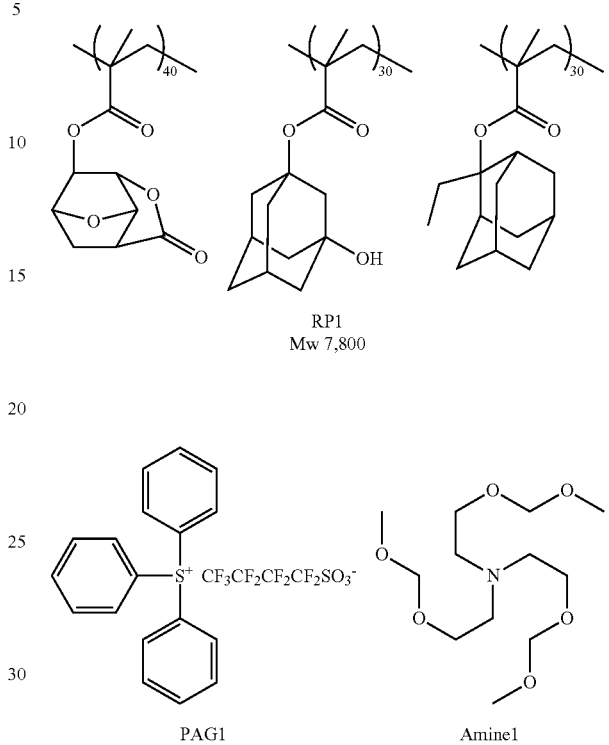

RP1
Mw 7,800

PAG1

Amine1

The liquid immersion top coat material (TC-1) was prepared by: dissolving 100 parts by mass of a top coat polymer (PP1) shown by the following formula in an organic solvent consisting of 2700 parts by mass of diisoamyl ether and 270 parts by mass of 2-methyl-1-butanol; and filtering the solution through a 0.1-μm filter made of a fluorinated resin.

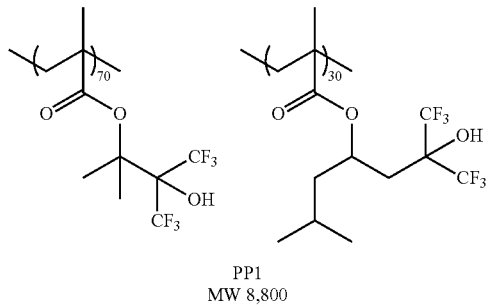

PP1
MW 8,800

The silicon-containing resist middle layer material (SOG-1) was prepared by: dissolving 100 parts by mass of an ArF silicon-containing middle layer film polymer (SiP1) shown by the following formula and 1 part by mass of a crosslinking catalyst (CAT1) shown by the following formula in 4000 parts by mass of PGMEA containing 0.1 mass % FC-4430 (manufactured by Sumitomo 3M Ltd.); and filtering the solution through a filter having a pore size of 0.1 μm and made of a fluorinated resin.

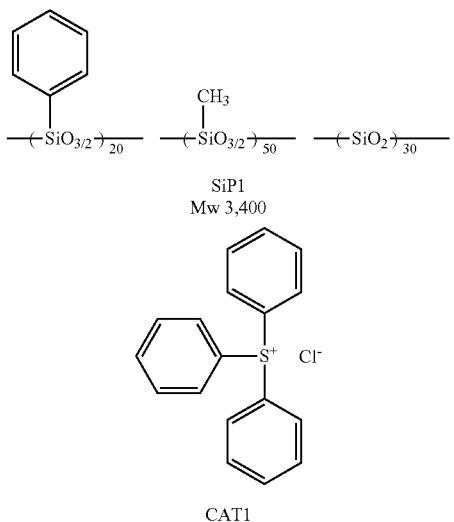

SiP1
Mw 3,400

CAT1

Next, the resulting substrate was exposed to light at various exposure levels with an ArF liquid immersion exposure apparatus (NSR-S610C manufactured by Nikon Corporation, NA: 1.30, σ: 0.98/0.65, 35° s-polarized dipole illumination, 6% halftone phase shift mask), baked at 100° C. for 60 seconds (PEB), and developed with a 2.38 mass % tetramethylammonium hydroxide (TMAH) aqueous solution for 30 seconds. Thus, a positive line and space pattern was obtained with the resist line width ranging from 50 nm to 30 nm at a pitch of 100 nm.

Then, dry-etching processing with an etching apparatus Telius manufactured by Tokyo Electron Limited was performed successively as follows. The silicon-containing middle layer was processed using the resist pattern as a mask; the underlayer film was processed using the silicon-containing middle layer as a mask; and the $SiO_2$ film was processed using the underlayer film as a mask.

The etching conditions were as follows.

Conditions for Transferring the Resist Pattern to the SOG Film:

| Chamber pressure | 10.0 Pa |
|---|---|
| RF power | 1,500 W |
| $CF_4$ gas flow rate | 15 sccm |
| $O_2$ gas flow rate | 75 sccm |
| Time | 15 sec |

Conditions for Transferring the SOG Film to the Underlayer Film:

| Chamber pressure | 2.0 Pa |
|---|---|
| RF power | 500 W |
| Ar gas flow rate | 75 sccm |
| $O_2$ gas flow rate | 45 sccm |
| Time | 120 sec |

Transferring Conditions to the $SiO_2$ Film:

| Chamber pressure | 2.0 Pa |
|---|---|
| RF power | 2,200 W |
| $C_5F_{12}$ gas flow rate | 20 sccm |
| $C_2F_6$ gas flow rate | 10 sccm |
| Ar gas flow rate | 300 sccm |
| $O_2$ gas flow rate | 60 sccm |
| Time | 90 sec |

The pattern cross sections were observed with an electron microscope (S-4700) manufactured by Hitachi, Ltd. The profiles were compared and summarized in Table 6.

TABLE 6

| | Resist underlayer film material | Pattern profile after development | Profile after etching for transferring to middle layer | Profile after etching for transferring to underlayer film | Profile after etching for transferring to substrate | Minimum dimension (nm) without pattern twisting after etching for transferring to substrate |
|---|---|---|---|---|---|---|
| Example 4-1 | UDL-1 | vertical profile | vertical profile | vertical profile | vertical profile | 32 |
| Example 4-2 | UDL-2 | vertical profile | vertical profile | vertical profile | vertical profile | 33 |
| Example 4-3 | UDL-3 | vertical profile | vertical profile | vertical profile | vertical profile | 34 |
| Example 4-4 | UDL-4 | vertical profile | vertical profile | vertical profile | vertical profile | 30 |
| Example 4-5 | UDL-5 | vertical profile | vertical profile | vertical profile | vertical profile | 30 |
| Example 4-6 | UDL-6 | vertical profile | vertical profile | vertical profile | vertical profile | 29 |
| Example 4-7 | UDL-7 | vertical profile | vertical profile | vertical profile | vertical profile | 31 |
| Example 4-8 | UDL-8 | vertical profile | vertical profile | vertical profile | vertical profile | 30 |
| Example 4-9 | UDL-9 | vertical profile | vertical profile | vertical profile | vertical profile | 30 |
| Example 4-10 | UDL-10 | vertical profile | vertical profile | vertical profile | vertical profile | 29 |

TABLE 6-continued

| | Resist underlayer film material | Pattern profile after development | Profile after etching for transferring to middle layer | Profile after etching for transferring to underlayer film | Profile after etching for transferring to substrate | Minimum dimension (nm) without pattern twisting after etching for transferring to substrate |
|---|---|---|---|---|---|---|
| Example 4-11 | UDL-11 | vertical profile | vertical profile | vertical profile | vertical profile | 31 |
| Example 4-12 | UDL-12 | vertical profile | vertical profile | vertical profile | vertical profile | 30 |
| Comparative Example 4-1 | Comparative UDL-1 | no pattern | — | — | — | — |
| Comparative Example 4-2 | Comparative UDL-2 | vertical profile | vertical profile | vertical profile | vertical profile | 42 |

As shown in Table 6, the results of Examples 4-1 to 4-12 revealed that when UDL-1 to -12 were used as resist underlayer film of the three-layer resists for liquid immersion lithography, the resist profiles after the development were favorable in the pattern profile evaluation. This indicates useful effect as an antireflective film. In contrast, Comparative UDL-1 used in Comparative Example 4-1 is not thermosetting, and did not attein solvent resistance Thus, when the silicon-containing resist middle layer material (SOG-1) was applied, the film was dissolved, so that no pattern was formed. In Comparative Example 4-2 using Comparative UDL-2, the resist pattern was successfully formed, and the pattern profile after the etching was compared.

Regarding the pattern profiles after the etching in Examples 4-1 to 4-12, the resist profiles after the development and the profiles of the underlayer films after oxygen etching and substrate-processing etching were all favorable. In accordance with the resist line width formed by the light exposure, the pattern dimension transferred to the substrate was also changed. In Comparative Example 4-2, the pattern was twisted at the line width of approximately 40 nm. In contrast, in Examples 4-1 to 4-12 using the inventive polymer, no twisting occurred until the pattern dimension was reduced to 35 nm. These revealed that the organic film formed from the composition for forming an organic film containing the inventive polymer has high twisting resistance. It is understood that as in the case of the inventive polymer, when a fine and high-strength organic film having a hardness exceeding 0.60 GPa is used as a resist underlayer film, high twisting resistance is obtained.

Examples 5-1 to 5-12 (Filling Property)

On a stepped SiO$_2$ substrate which was a SiO$_2$ substrate having a dense hole pattern with a thickness of 500 nm and a diameter of 160 nm formed thereon, a resist underlayer film was formed by applying one of UDL-1 to -12 under such conditions that the film with a thickness of 80 nm was formed on a flat substrate by baking at 350° C. for 60 seconds. Each substrate having such a resist underlayer film formed thereon was split and observed with a scanning electron microscope (SEM) to check whether the resist underlayer film was filled to the bottoms of the holes. Table 7 shows the result.

TABLE 7

| | Resist underlayer film material | Filling property |
|---|---|---|
| Example 5-1 | UDL-1 | favorably filled to the bottoms of holes |
| Example 5-2 | UDL-2 | favorably filled to the bottoms of holes |
| Example 5-3 | UDL-3 | favorably filled to the bottoms of holes |
| Example 5-4 | UDL-4 | favorably filled to the bottoms of holes |
| Example 5-5 | UDL-5 | favorably filled to the bottoms of holes |
| Example 5-6 | UDL-6 | favorably filled to the bottoms of holes |
| Example 5-7 | UDL-7 | favorably filled to the bottoms of holes |
| Example 5-8 | UDL-8 | favorably filled to the bottoms of holes |
| Example 5-9 | UDL-9 | favorably filled to the bottoms of holes |
| Example 5-10 | UDL-10 | favorably filled to the bottoms of holes |
| Example 5-11 | UDL-11 | favorably filled to the bottoms of holes |
| Example 5-12 | UDL-12 | favorably filled to the bottoms of holes |

As shown in Table 7, in all of Examples 5-1 to 5-12 in which the resist underlayer films were formed by using UDL-1 to UDL-12 of the present invention, the holes were favorably filled to the bottoms. This indicates that even when a substrate to be processed has a step(s), sufficient filling property can be expected, and the composition according to the present invention has useful properties as a resist underlayer film material for multilayer processes.

Examples 6-1 to 6-4, Comparative Examples 6-1 and 6-2 (Planarizing Property)

Each composition (UDL-1, -3, -11, -12, Comparative UDL-1, -2) for forming an organic film was applied onto a SiO$_2$ wafer substrate having a giant isolated trench pattern (trench width: 10 μm, trench depth: 0.10 μm) and baked in the atmosphere at 350° C. for 60 seconds. Then, a step (delta in FIG. 2) between the trench portion and the non-trench portion of the organic film was observed with an atomic force microscope (AFM) NX10 manufactured by Park systems Corp. Table 8 shows the result. In this evaluation, the smaller the step, the more favorable the planarizing property.

Note that, in this evaluation, a trench pattern having a depth of 0.10 μm was generally planarized using a composition for forming an organic film having a film thickness of approximately 0.2 μm. This is a strict evaluation condition to evaluate the planarizing property.

TABLE 8

|  | Resist underlayer film material | Step (nm) |
|---|---|---|
| Example 6-1 | UDL-1 | 75 |
| Example 6-2 | UDL-3 | 70 |
| Example 6-3 | UDL-11 | 65 |
| Example 6-4 | UDL-12 | 65 |
| Comparative Example 6-1 | Comparative UDL-1 | 90 |
| Comparative Example 6-2 | Comparative UDL-2 | 90 |

As shown in Table 8, the organic films obtained from the inventive compositions for forming an organic film had smaller steps between the trench and non-trench portions than those in Comparative Examples 6-1, 6-2. This verified that the inventive compositions are excellent in planarizing property. It is presumed that in Comparative Examples 6-1 and 6-2, the films are inferior in fineness and considerably shrunk by baking, therefor the film thickness difference between the upper portion and the lower portion of the step was emphasized by the baking, and the planarizing property was poor. Moreover, the comparison between Examples 6-3, 6-4 in which the high-boiling-point solvents were added and Examples 6-1, 6-2 without the high-boiling-point solvents shows that adding the high-boiling-point solvents improved the planarizing property.

From the above, the inventive composition for forming an organic film results in an organic film having high etching resistance and excellent twisting resistance during etching. This organic film is quite useful as an underlayer film for multilayer resist processes, particularly a three-layer resist process, for ultrafine and very precise patterning.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A composition for forming an organic film, comprising:
a polymer having a structure shown by the following general formula (1A); and
an organic solvent,

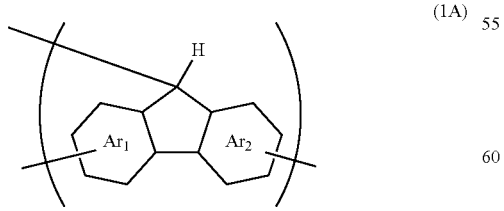

wherein $Ar_1$ and $Ar_2$ each represent a benzene ring or a naphthalene ring which optionally have a substituent, wherein the polymer is a copolymer derived from only reactive monomers, and wherein the polymer further has a partial structure shown by the following general formula (1C):

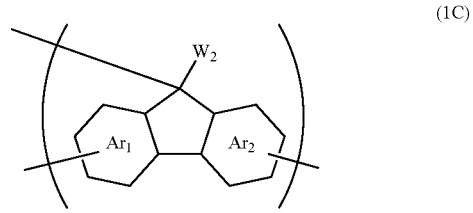

wherein $W_2$ represents a monovalent organic group having 1 to 50 carbon atoms; and
$Ar_1$ and Ar2 are as defined above.

2. The composition for forming an organic film according to claim 1, wherein the polymer further has a partial structure shown by the following general formula (1B), the following general formula (1B') or the following general formula (1B''),

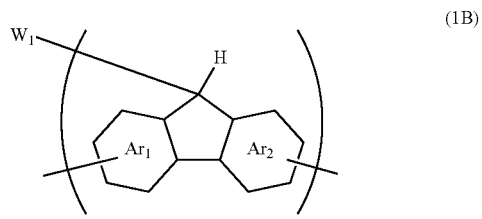

wherein $W_1$ represents a hydroxyl group, an alkyloxy group having 1 to 10 carbon atoms, or an organic group having one or more aromatic rings which optionally have a substituent; and $Ar_1$ and Ar2 each represent a benzene ring or a naphthalene ring which optionally have a substituent,

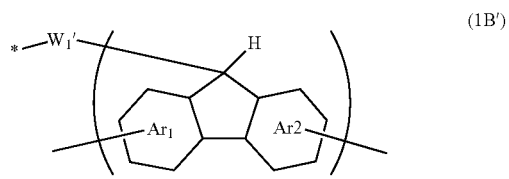

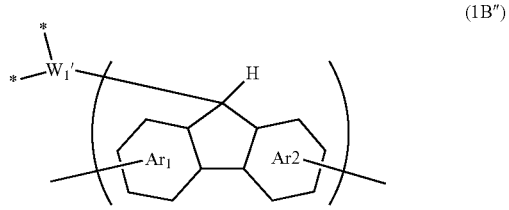

wherein $W_1'$ represents an organic group having one of more aromatic rings which optionally have a substituent, * represents another partial structure; and $Ar_1$ and Ar2 each represent a benzene ring or a naphthalene ring which optionally have a substituent.

3. The composition for forming an organic film according to claim 1, wherein the polymer has a weight-average molecular weight of 500 to 5000.

4. The composition for forming an organic film according to claim 1, wherein the organic solvent is a mixture of one or more organic solvents each having a boiling point of lower than 180° C. and one or more organic solvents each having a boiling point of 180° C. or higher.

5. The composition for forming an organic film according to claim 1, further comprising at least one of a surfactant and a plasticizer.

6. A patterning process comprising the steps of:
forming an organic film by using the composition for forming an organic film according to claim 1 on a body to be processed;
forming a silicon-containing resist underlayer film by using a silicon-containing resist underlayer film material on the organic film;
forming a resist upper layer film by using a photoresist composition on the silicon-containing resist underlayer film;
forming a circuit pattern in the resist upper layer film;
transferring the pattern to the silicon-containing resist underlayer film by etching using the resist upper layer film having the formed circuit pattern as a mask;
transferring the pattern to the organic film by etching using the silicon-containing resist underlayer film having the transferred pattern as a mask; and
forming the pattern in the body to be processed by etching using the organic film having the transferred pattern as a mask.

7. A patterning process comprising the steps of:
forming an organic film by using the composition for forming an organic film according to claim 1 on a body to be processed;
forming a silicon-containing resist underlayer film by using a silicon-containing resist underlayer film material on the organic film;
forming an organic antireflective coating (BARC) on the silicon-containing resist underlayer film;
forming a resist upper layer film by using a photoresist composition on the BARC;
forming a circuit pattern in the resist upper layer film;
successively transferring the pattern to the BARC and the silicon-containing resist underlayer film by etching using the resist upper layer film having the formed circuit pattern as a mask;
transferring the pattern to the organic film by etching using the silicon-containing resist underlayer film having the transferred pattern as a mask; and
etching the body to be processed using the organic film having the transferred pattern as a mask to form the pattern in the body to be processed.

8. A patterning process comprising the steps of:
forming an organic film by using the composition for forming an organic film according to claim 1 on a body to be processed;
forming an inorganic hard mask selected from a silicon oxide film, a silicon nitride film, and a silicon oxynitride film on the organic film;
forming a resist upper layer film by using a photoresist composition on the inorganic hard mask;
forming a circuit pattern in the resist upper layer film;
transferring the pattern to the inorganic hard mask by etching using the resist upper layer film having the formed circuit pattern as a mask;
transferring the pattern to the organic film by etching using the inorganic hard mask having the formed pattern as a mask; and
etching the body to be processed using the organic film having the formed pattern as a mask to form the pattern in the body to be processed.

9. A patterning process comprising the steps of:
forming an organic film by using the composition for forming an organic film according to claim 1 on a body to be processed;
forming an inorganic hard mask selected from a silicon oxide film, a silicon nitride film, and a silicon oxynitride film on the organic film;
forming a BARC on the inorganic hard mask;
forming a resist upper layer film by using a photoresist composition on the BARC;
forming a circuit pattern in the resist upper layer film;
successively transferring the pattern to the BARC and the inorganic hard mask by etching using the resist upper layer film having the formed circuit pattern as a mask;
transferring the pattern to the organic film by etching using the inorganic hard mask having the formed pattern as a mask; and
etching the body to be processed using the organic film having the formed pattern as a mask to form the pattern in the body to be processed.

10. The patterning process according to claim 8, wherein the inorganic hard mask is formed by a CVD method or an ALD method.

11. The patterning process according to claim 9, wherein the inorganic hard mask is formed by a CVD method or an ALD method.

12. The patterning process according to claim 6, wherein the circuit pattern is formed in the resist upper layer film by a photolithography with a wavelength of 10 nm or more and 300 nm or less, direct lithography with electron beam, nanoimprinting, or a combination thereof.

13. The patterning process according to claim 6, wherein alkali development or organic solvent development is employed as a development method.

14. The patterning process according to claim 6, wherein the body to be processed is a semiconductor device substrate, a metal film, a metal carbide film, a metal oxide film, a metal nitride film, a metal oxycarbide film, or a metal oxynitride film.

15. The patterning process according to claim 14, wherein the metal is silicon, titanium, tungsten, hafnium, zirconium, chromium, germanium, copper, silver, gold, aluminum, indium, gallium, arsenic, palladium, iron, tantalum, iridium, molybdenum, or an alloy thereof.

16. A polymer comprising a structure shown by the following general formula (1A):

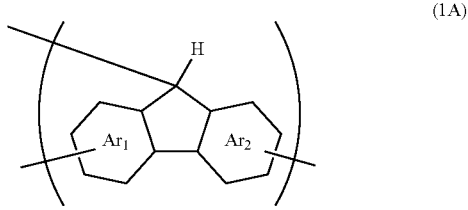

(1A)

wherein $Ar_1$ and Ar2 each represent a benzene ring or a naphthalene ring which optionally have a substituent,
the polymer further comprising a partial structure shown by the following general formula (1C),

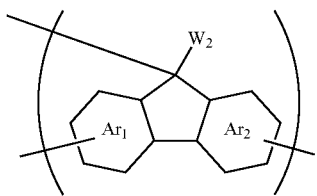

(1C)

wherein $W_2$ represents a monovalent organic group having 1 to 50 carbon atoms; and
$Ar_1$ and Ar2 are as defined above, and
wherein the polymer is a copolymer derived from only reactive monomers.

17. The polymer according to claim 16, further comprising a partial structure shown by the following general formula (1B), the following general formula (1B') or the following general formula (1B"),

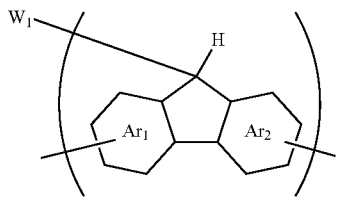

(1B)

wherein $W_1$ represents a hydroxyl group, an alkyloxy group having 1 to 10 carbon atoms, or an organic group having one or more aromatic rings which optionally have a substituent; and $Ar_1$ and Ar2 each represent a benzene ring or a naphthalene ring which optionally have a substituent,

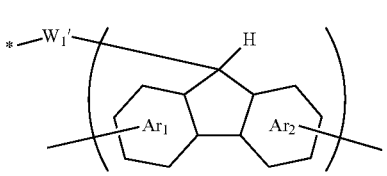

(1B')

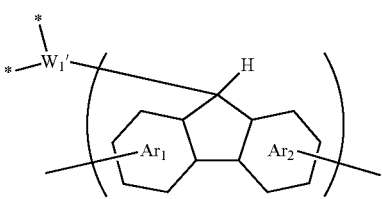

(1B")

wherein $W_1'$ represents an organic group having one or more aromatic rings which optionally have a substituent; * represents another partial structure; and $Ar_1$ and Ar2 each represent a benzene ring or a naphthalene ring which optionally have a substituent.

* * * * *